(12) United States Patent
Heo et al.

(10) Patent No.: US 12,707,770 B2
(45) Date of Patent: Aug. 11, 2026

(54) DISPLAY DEVICE USING SEMICONDUCTOR LIGHT-EMITTING ELEMENTS

(71) Applicant: LG ELECTRONICS INC., Seoul (KR)

(72) Inventors: Mihee Heo, Seoul (KR); Hyeyoung Yang, Seoul (KR); Jisoo Ko, Seoul (KR)

(73) Assignee: LG ELECTRONICS INC, Seoul (KR)

( * ) Notice: Subject to any disclaimer, the term of this patent is extended or adjusted under 35 U.S.C. 154(b) by 369 days.

(21) Appl. No.: 18/271,183

(22) PCT Filed: Jan. 6, 2021

(86) PCT No.: PCT/KR2021/000117
§ 371 (c)(1),
(2) Date: Jul. 6, 2023

(87) PCT Pub. No.: WO2022/149628
PCT Pub. Date: Jul. 14, 2022

(65) Prior Publication Data

US 2024/0072213 A1 Feb. 29, 2024

(51) Int. Cl.
*H01L 33/48* (2010.01)
*H10H 20/819* (2025.01)
(Continued)

(52) U.S. Cl.
CPC ...... *H10H 20/8506* (2025.01); *H10H 20/819* (2025.01); *H10W 90/00* (2026.01)

(58) Field of Classification Search
CPC .. H10H 20/8506; H10H 20/819; H10H 20/01; H10H 20/857; H01L 25/167; H01L 25/0753; H01L 2224/95101; H01L 25/16; H01L 2224/95085; H01L 2224/95136; H01L 2924/12041; H10D 86/00
See application file for complete search history.

(56) References Cited

U.S. PATENT DOCUMENTS

2016/0380158 A1* 12/2016 Sasaki ..................... H01L 24/95 257/89
2020/0043901 A1 2/2020 Ahmed et al.
2020/0203321 A1* 6/2020 Choi .................. H01L 25/0753

FOREIGN PATENT DOCUMENTS

KR 10-2017-0010119 A 1/2017
KR 10-2017-0095914 A 8/2017
(Continued)

*Primary Examiner* — Elmito Breval
(74) *Attorney, Agent, or Firm* — Birch, Stewart, Kolasch & Birch, LLP

(57) ABSTRACT

A display device, according to the present invention, comprises a red semiconductor light-emitting element, a green semiconductor light-emitting element and a blue semiconductor light-emitting element, and comprises: a substrate on which the red, green and blue semiconductor light-emitting elements are arranged; and receiving holes which are formed on the substrate and in which the red, green and blue semiconductor light-emitting elements are assembled, wherein the red, green and blue semiconductor light-emitting elements each comprise a tip on a side surface thereof, such that at least any one among the angle formed by the tip and the thickness of one side with respect to the tip is formed so as to be different.

8 Claims, 16 Drawing Sheets

(51) Int. Cl.
*H10H 20/85* (2025.01)
*H10W 90/00* (2026.01)

(56) References Cited

FOREIGN PATENT DOCUMENTS

| | | | |
|---|---|---|---|
| KR | 10-2018-0020239 | A | 2/2018 |
| KR | 10-2019-0105537 | A | 9/2019 |
| KR | 10-2020-0003942 | A | 1/2020 |

* cited by examiner

DISPLAY DEVICE USING SEMICONDUCTOR LIGHT-EMITTING ELEMENTS

CROSS REFERENCE TO RELATED APPLICATION

This application is the National Phase of PCT International Application No. PCT/KR2021/000117, filed on Jan. 6, 2021, which is hereby expressly incorporated by reference into the present application.

TECHNICAL FIELD

The present disclosure relates to a display device using semiconductor light-emitting elements, particularly, semiconductor light-emitting elements having a size of several to several tens of μm.

BACKGROUND ART

In recent years, in the field of display technology, liquid-crystal displays (LCDs), organic light-emitting diodes (OLED) displays, semiconductor light-emitting displays, etc. have been competing to realize large-area displays.

Semiconductor light-emitting devices (elements, diodes) (hereinafter, microLEDs) with a cross-sectional area of 100 μm, when used in displays, may offer very high efficiency because the displays do not need a polarizer to absorb light. However, in order to implement large-scale displays, several millions of semiconductor light-emitting devices (elements) are required, which makes it difficult to transfer the semiconductor light-emitting devices, compared to other technologies.

In recent years, microLEDs can be transferred by pick & place, laser lift-off or self-assembly. Among others, the self-assembly approach is a method that allows semiconductor light-emitting devices to find their positions on their own in a fluid, which is most advantageous in realizing large-screen display devices.

Self-assembly methods may include a method of directly assembling semiconductor light-emitting devices on a final substrate to be used in a product, and a method of assembling semiconductor light-emitting devices on an assembly substrate and transferring the semiconductor light-emitting devices to a final substrate through an additional transfer process. The direct transfer method is efficient in terms of process, and the hybrid-transfer method is advantageous in terms of additionally using a structure for self-assembly without limitation. Therefore, the two methods are selectively used.

DISCLOSURE OF INVENTION

Technical Problem

One aspect of the present disclosure is to provide a display device using red, green, and blue semiconductor light-emitting elements, in particular, red, green, and blue semiconductor light-emitting elements having a structure capable of being simultaneously assembled.

Solution to Problem

To achieve the aspect and other advantages according to the present disclosure, there is provided a display device that includes a red semiconductor light-emitting element, a green semiconductor light-emitting element, and a blue semiconductor light-emitting element. The display device may include a substrate on which the red, green and blue semiconductor light-emitting elements are disposed, and receiving holes formed in the substrate such that the red, green, and blue semiconductor light-emitting elements are seated therein, and the red, green, and blue semiconductor light-emitting elements may include tips on side surfaces, respectively, and may be formed differently in view of at least one of a thickness of one side with respect to the tip and an angle formed by the tip.

In one embodiment, each of the red, green, and blue semiconductor light-emitting elements may be formed such that a cross section thereof including the tip is circular.

In one embodiment, each of the red, green and blue semiconductor light-emitting elements may include a first conductive electrode, a first conductive semiconductor layer on which the first conductive electrode is disposed, an active layer formed on the first conductive semiconductor layer, a second conductive semiconductor layer formed on the active layer, and a second conductive electrode disposed on the second conductive semiconductor layer to be spaced apart from the first conductive electrode in a horizontal direction. The tip may be formed on the active layer.

In one embodiment, each of the red, green, and blue semiconductor light-emitting elements may include the first conductive electrode and the first conductive semiconductor layer disposed on one side thereof and the second conductive semiconductor layer and the second conductive electrode disposed on another side, with respect to the tip.

In one embodiment, each of the red, green, and blue semiconductor light-emitting elements may be configured such that the one side, with respect to the tip, including the first conductive electrode and the first conductive semiconductor layer has a different thickness.

In one embodiment, the red semiconductor light emitting element, among the red, green and blue semiconductor light-emitting elements, may be configured such that the one side thereof has a thinnest thickness.

In one embodiment, the red, green and blue semiconductor light-emitting elements may have a thickness difference of at least 0.5 μm or more on the one side.

In one embodiment, the red semiconductor light emitting element, among the red, green and blue semiconductor light-emitting elements, may be configured to have a smallest angle formed by the tip.

In one embodiment, the red, green and blue semiconductor light-emitting elements may have a difference of at least 10 degrees or more between angles formed by the tips.

In one embodiment, the receiving holes in which the red, green, and blue semiconductor light-emitting elements are seated may be formed differently in view of at least one of a depth and an inclination of an inner surface thereof to correspond to the red, green, and blue semiconductor light emitting elements.

Advantageous Effects of Invention

The present disclosure enables simultaneous self-assembly by virtue of structural differences among red, green, and blue semiconductor light emitting elements in a vertical direction while maintaining a circular cross section. This can secure position selectivity of each semiconductor light-emitting element while maintaining an assembly speed of a circular semiconductor light emitting element, thereby allowing efficient self-assembly.

The present disclosure can manufacture a display device using red, green, and blue semiconductor light-emitting elements through simultaneous self-assembly. This may result in reducing the number of transfer processes and thus decreasing a tack time.

MODE FOR THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. Furthermore, it will be understood that when an element such as a layer, region or substrate is referred to as being "on" another element, it can be directly on the another element or an intermediate element may also be interposed therebetween.

A display device disclosed herein may include a portable (mobile) phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, the configuration according to the embodiment described herein can be applied as long as it can include a display even in a new product form to be developed later.

Figure 1:
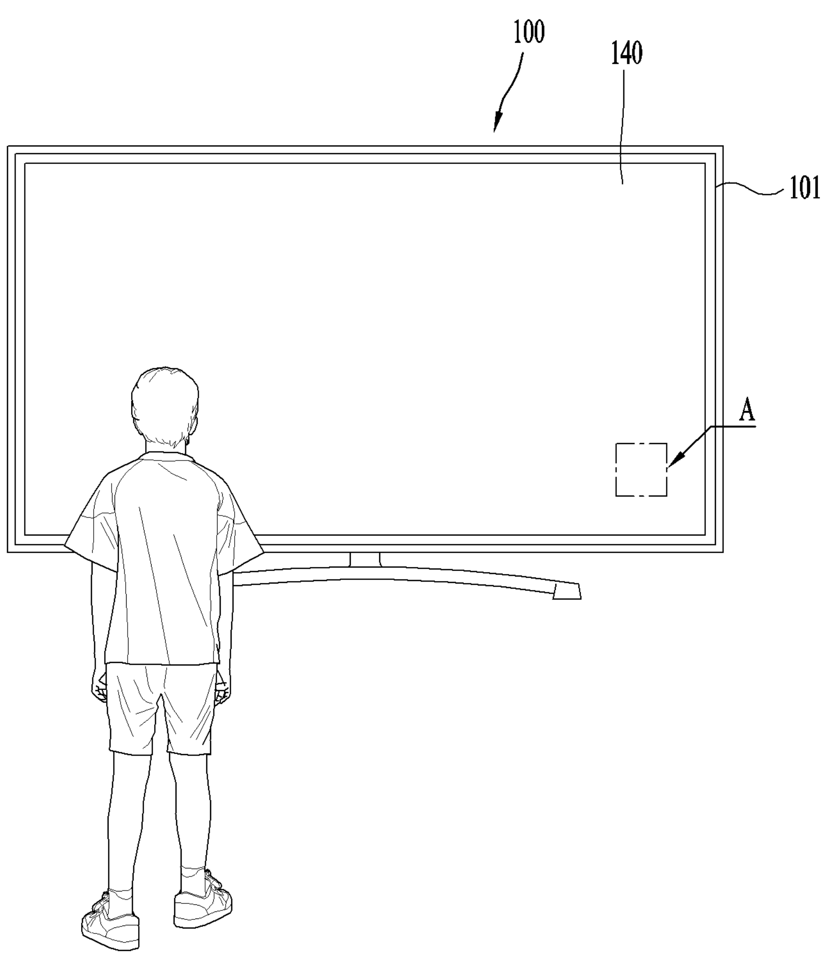
FIG. 1 is a conceptual view illustrating one embodiment of a display device using semiconductor light-emitting elements.
Figure 2:
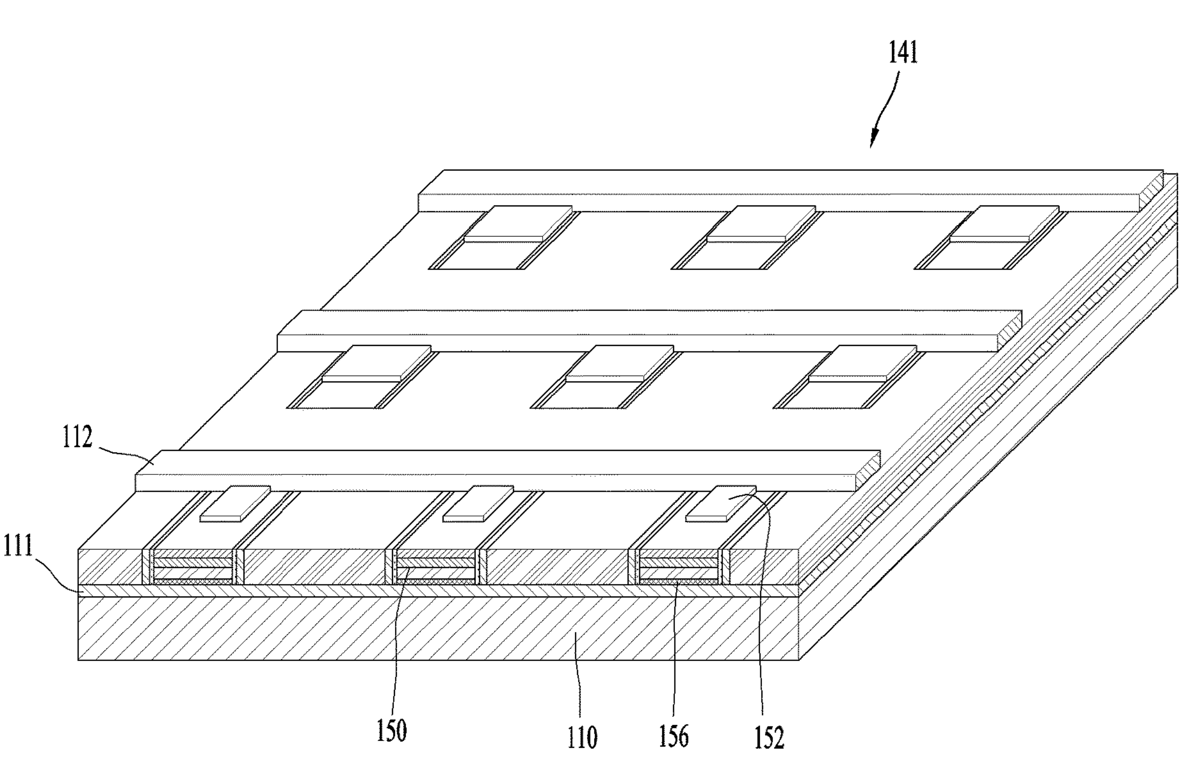
FIG. 2 is a partial enlarged view of a portion A in the display device of FIG. 1.
Figure 3:
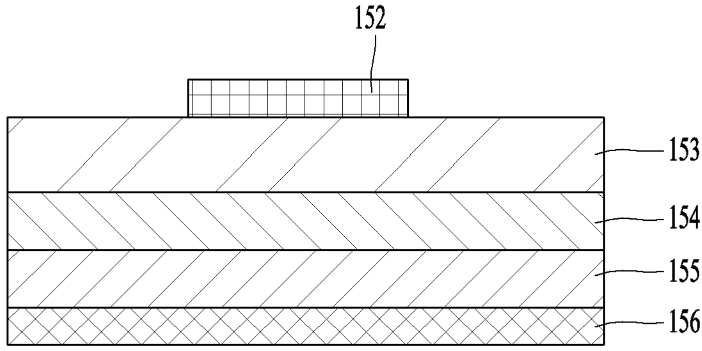
FIG. 3 is an enlarged view of the semiconductor light-emitting element of FIG. 2.
Figure 4:
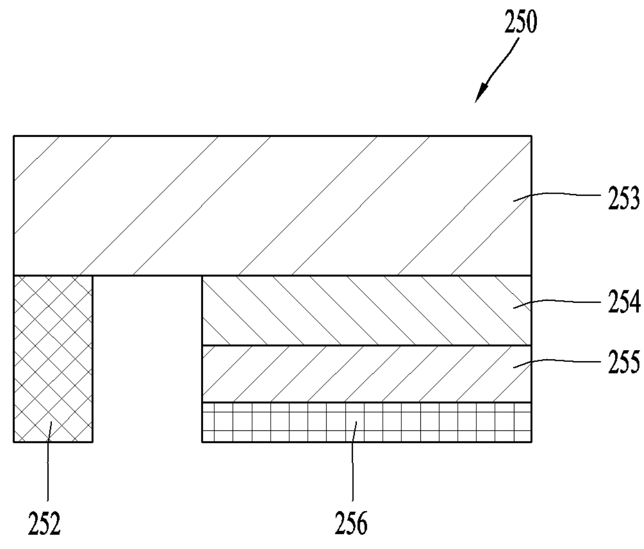
FIG. 4 is a view illustrating another embodiment of the semiconductor light-emitting element of FIG. 2.

FIG. 1 is a conceptual view illustrating one embodiment of a display device using semiconductor light-emitting elements, FIG. 2 is a partial enlarged view of a portion A in the display device of FIG. 1, FIG. 3 is an enlarged view of the semiconductor light-emitting element of FIG. 2, and FIG. 4 is a view illustrating another embodiment of the semiconductor light-emitting element of FIG. 2.

As illustrated, information processed by a controller of a display device 100 may be output on a display module 140. A closed loop-shaped case 101 that runs around the rim of the display module 140 may define the bezel of the display device 100.

The display module 140 may include a panel 141 that displays an image, and the panel 141 may include micro-sized semiconductor light-emitting elements (or diodes) 150 and a wiring substrate 110 where the semiconductor light-emitting elements 150 are mounted.

The wiring substrate 110 may be provided with wirings, which can be connected to n-type electrodes 152 and p-type electrodes 156 of the semiconductor light-emitting elements 150. As such, the semiconductor light-emitting elements 150 may be provided on the wiring substrate 110 as individual pixels that emit light on their own.

The image displayed on the panel 141 may be visual information, which is rendered by controlling the light emission of unit pixels arranged in a matrix configuration independently through the wirings.

The present disclosure takes microLEDs (light-emitting elements) as an example of the semiconductor light-emitting elements 150 which convert current into light. The microLEDs may be light-emitting elements that are small in size less than 100 μm. The semiconductor light-emitting elements 150 may have light-emitting regions of red, green, and blue, and unit pixels may be produced by combinations of these colors. That is, the unit pixels are the smallest units for producing one color. Each unit pixel may contain at least three microLEDs.

More specifically, referring to FIG. 3, the semiconductor light-emitting element 150 may have a vertical structure.

For example, the semiconductor light-emitting elements 150 may be implemented as high-power light-emitting elements that are composed mostly of gallium nitride (GaN), with some indium (In) and/or aluminum (Al) added to it, and emit light of various colors.

Such a vertical semiconductor light-emitting element may include a p-type electrode 156, a p-type semiconductor layer 155 disposed on the p-type semiconductor layer 156, an active layer 154 disposed on the p-type semiconductor layer 155, an n-type semiconductor layer 153 disposed on the active layer 154, and an n-type electrode 152 disposed on the n-type semiconductor layer 153. In this case, the p-type electrode 156 at the bottom may be electrically connected to a p-electrode 111 of the wiring substrate, and the upper n-type electrode 152 at the top may be electrically connected to an n-electrode 112 above the semiconductor light-emitting element. The electrodes can be disposed in an upward/downward direction in the vertical semiconductor light-emitting element 150, thereby providing a great advantage of reducing a chip size.

In another example, referring to FIG. 4, the semiconductor light-emitting elements may be flip chip-type light-emitting elements.

As an example of such a flip chip-type light-emitting element, the semiconductor light-emitting element 250 may include a p-type electrode 256, a p-type semiconductor layer 255 disposed on the p-type layer 256, an active layer 254 disposed on the p-type semiconductor layer 255, an n-type semiconductor layer 253 disposed on the active layer 254, and an n-type electrode 252 vertically separated from the p-type electrode 256 on the n-type semiconductor layer 253. In this case, both the p-type electrode 256 and the n-type electrode 252 may be electrically connected to a p electrode and an n electrode of the wiring substrate, below the semiconductor light-emitting element.

The vertical semiconductor light-emitting element and a flip-type light-emitting element each may be used as a green semiconductor light-emitting element, blue semiconductor light-emitting element, or red semiconductor light-emitting element. The green semiconductor light-emitting element and the blue semiconductor light-emitting element may be implemented as high-power light-emitting elements that are composed mostly of gallium nitride (GaN), with some indium (In) and/or aluminum (Al) added to it, and emit green and blue light, respectively. As an example, the semiconductor light-emitting elements may be made of gallium nitride thin films which include various layers of n-Gan, p-GaN, AlGaN, InGaN, etc. More specifically, the p-type semiconductor layer may be P-type GaN, and the n-type semiconductor layer may be N-type GaN. However, for the red semiconductor light-emitting element, the p-type semiconductor layer may be P-type GaAs, and the n-type semiconductor layer may be N-type GaAs.

Moreover, the p-type semiconductor layer may be P-type GaN doped with Mg on the p electrode, and the n-type semiconductor layer may be N-type GaN doped with Si on the n electrode. In this case, the above-described semiconductor light-emitting elements may be semiconductor light-emitting elements without the active layer.

In some examples, referring to FIGS. 1 to 4, because of the very small size of the light-emitting elements, self-emissive, high-definition unit pixels may be arranged on the display panel, and therefore the display device can deliver high picture quality.

In the display device using the semiconductor light-emitting elements, semiconductor light-emitting elements may be grown on a wafer, formed through mesa and isolation, and used as individual pixels. The micro-sized semiconductor light-emitting elements 150 should be transferred onto preset positions on a substrate of the display panel. One of the transfer technologies available may be pick and place, but it has a low success rate and requires a lot of time. In another example, a number of diodes may be transferred at a time by using a stamp or roll, which, however, is not suitable for large-screen displays because of limited yields. The present disclosure proposes a new method and device for manufacturing a display device that can solve these problems.

To this end, a new method for manufacturing a display device will be described first below. FIGS. 5A to 5E are conceptual views illustrating a new process for manufacturing the semiconductor light-emitting elements (or diodes).

In this specification, a display device using passive matrix (PM) semiconductor light-emitting elements will be illustrated. It should be noted that the illustration given below is also applied to active matrix (AM) semiconductor light-emitting elements. In addition, the self-assembly method described in this specification can be applied to both horizontal semiconductor light-emitting elements and vertical semiconductor light-emitting elements.

Figure 5A:
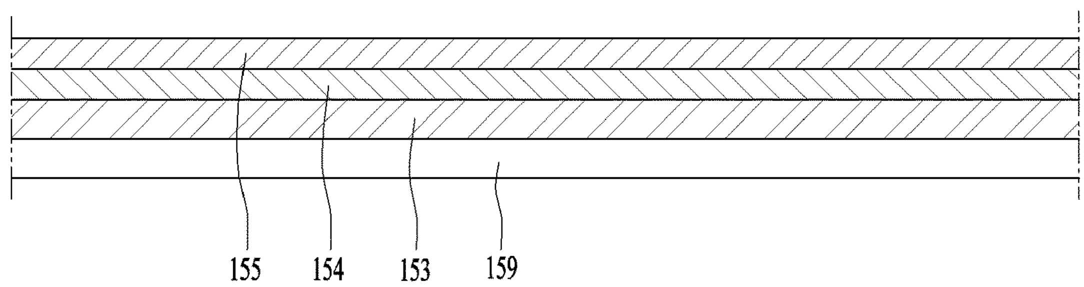
FIGS. 5A to 5E are conceptual diagrams illustrating a new process for manufacturing a semiconductor light-emitting element.

First of all, according to the manufacturing method of the display device, a first conductive semiconductor layer 153, an active layer 154, and a second conductive semiconductor layer 155 are grown on a growth substrate 159 (FIG. 5A).

Once the first conductive semiconductor layer 153 is grown, the active layer 154 may be grown on the first conductive semiconductor layer 153 and then the second conductive semiconductor layer 155 may be grown on the active layer 154. By sequentially growing the first conductive semiconductor layer 153, the active layer 154, and the second conductive semiconductor layer 155, the first conductive semiconductor layer 153, the active layer 154, and the second conductive semiconductor layer 155 may form a stack structure as illustrated in FIG. 5A.

In this case, the first conductive semiconductor layer 153 may be a n-type semiconductor layer, and the second conductive semiconductor layer 155 may be a p-type semiconductor layer. However, the present disclosure is not necessarily limited to this, and the first conductive type may be p-type and the second conductive type may be n-type.

Moreover, although this exemplary embodiment is illustrated by assuming the presence of the active layer, the active layer may be omitted, if necessary, as stated above. In an example, the p-type semiconductor layer may be P-type GaN doped with Mg, and the n-type semiconductor layer may be N-type GaN doped with Si on the n electrode.

The growth substrate 159 (wafer) may be formed of, but not limited to, light-transmissive material, for example, one of sapphire (Al2O3), GaN, ZnO, and AlO. Also, the growth substrate 159 may be made of a material suitable for growing semiconductor materials, namely, a carrier wafer. The growth substrate 2101 may also be formed of a material having high thermal conductivity. The growth substrate 2101 may use at least one of a SiC substrate having higher thermal conductivity than the sapphire (Al2O3) substrate, Si, GaAs, GaP, InP and Ga2O3, in addition to a conductive substrate or an insulating substrate.

Figure 5B:
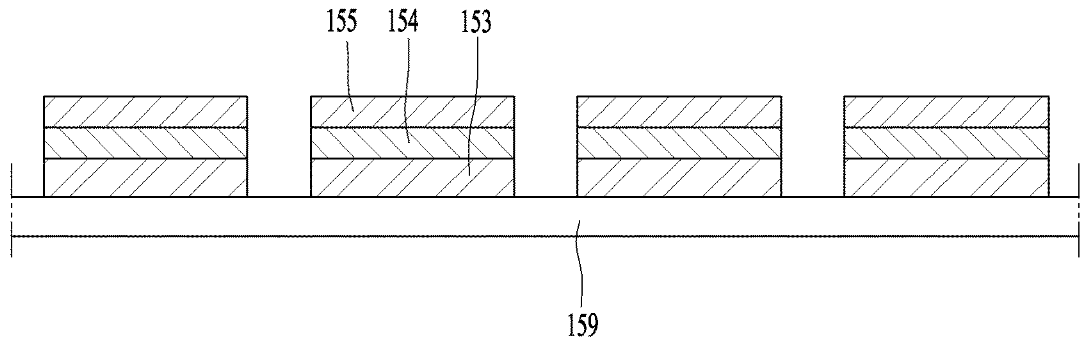

Next, a plurality of semiconductor light-emitting elements may be formed by removing at least parts of the first conductive semiconductor layer 153, the active layer 154, and the second conductive semiconductor layer 155 (FIG. 5B).

More specifically, isolation may be performed so that the plurality of light-emitting elements form a light-emitting element array. That is, a plurality of semiconductor light-emitting elements may be formed by vertically etching the first conductive semiconductor layer 153, the active layer 154, and the second conductive semiconductor layer 155.

In the case of horizontal semiconductor light-emitting elements, a mesa process may be performed which exposes the first conductive semiconductor layer 153 to the outside by vertically removing part of the active layer 154 and the second conductive semiconductor layer 155, and then isolation may be performed which forms an array of semiconductor light-emitting elements by etching the first conductive semiconductor layer 153.

Figure 5C:
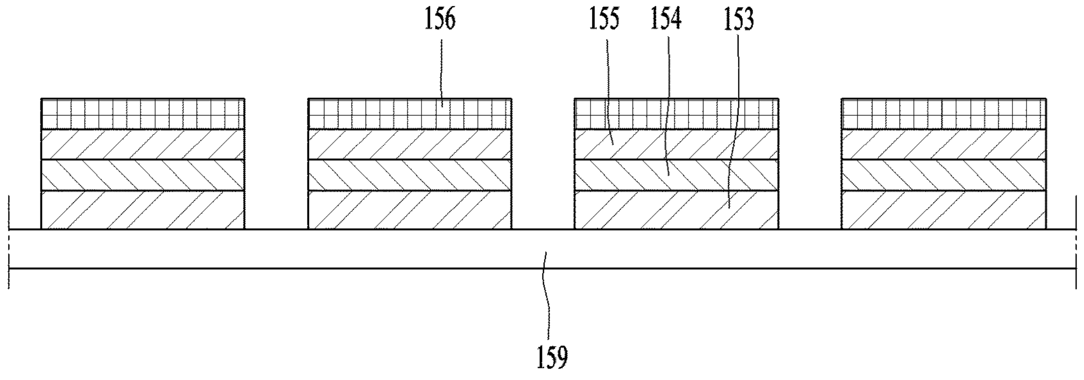

Next, a second conductive electrode 156 (or p-type electrode) may be formed on one surface of the second conductive semiconductor layer 155 (FIG. 5C). The second conductive electrode 156 may be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 may serve as an n-type electrode.

Figure 5D:
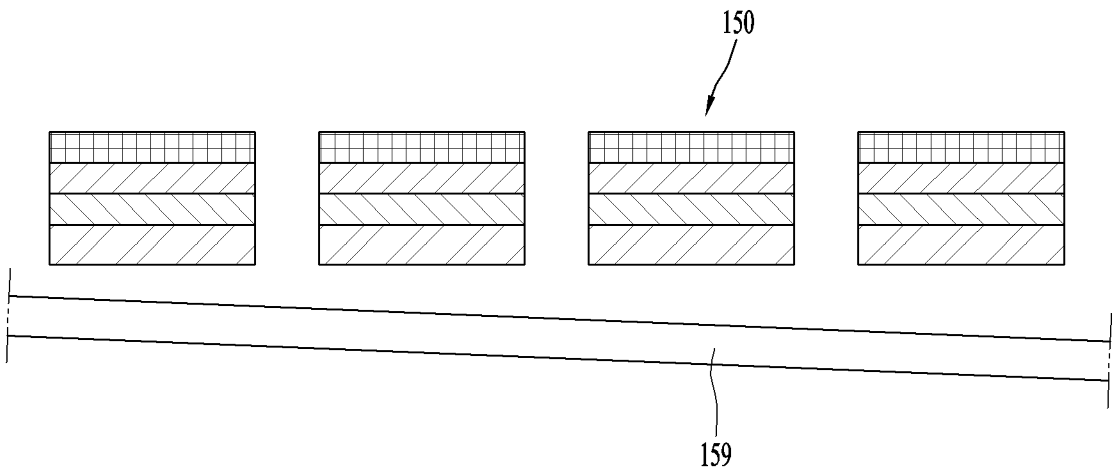

Next, the growth substrate 159 may be removed, thus leaving a plurality of semiconductor light-emitting elements. For example, the growth substrate 159 may be removed using laser lift-off (LLO) or chemical lift-off (CLO) (FIG. 5D).

Figure 5E:
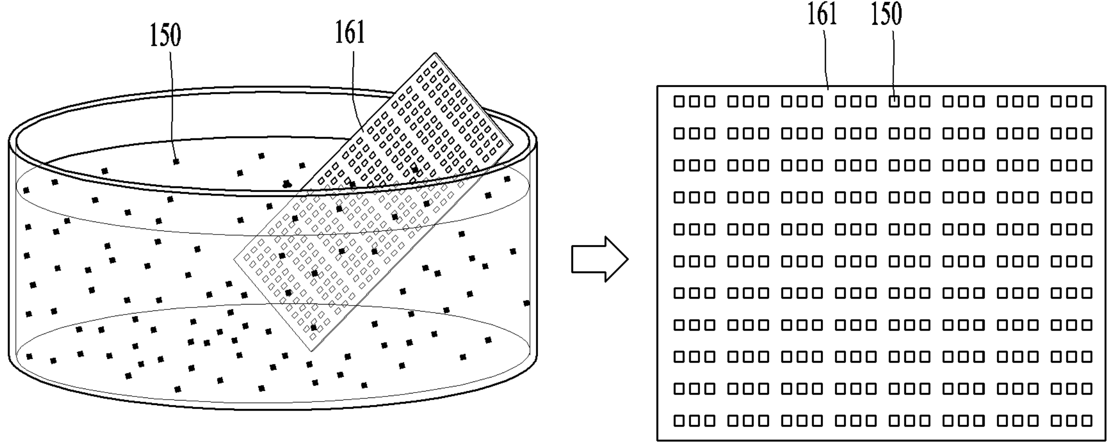

Afterwards, the step of mounting the semiconductor light-emitting elements 150 on a substrate in a chamber filled with a fluid may be performed (FIG. 5E).

For example, the semiconductor light-emitting elements 150 and the substrate 161 may be put into a chamber filled with a fluid, and the semiconductor light-emitting elements may be self-assembled onto the substrate 161 using fluidity, gravity, surface tension, etc. In this case, the substrate may be an assembly substrate 161.

In another example, a wiring substrate, instead of the assembly substrate 161, may be put into a fluid chamber, and the semiconductor light-emitting elements 150 may be mounted directly onto the wiring substrate. In this case, the substrate may be a wiring substrate. For convenience of explanation, the present disclosure is illustrated with an example in which the semiconductor light-emitting elements 150 are mounted onto the assembly substrate 161.

To facilitate the mounting of the semiconductor light-emitting elements 150 onto the assembly substrate 161, cells (not illustrated) into which the semiconductor light-emitting elements 150 are fitted may be provided on the assembly substrate 161. Specifically, cells where the semiconductor light-emitting elements 150 are mounted may be disposed on the assembly substrate 161 at positions where the semiconductor light-emitting elements 150 are aligned with wiring electrodes. The semiconductor light-emitting elements 150 may be assembled to the cells as they move within the fluid.

After arraying the semiconductor light-emitting elements 150 on the assembly substrate 161, the semiconductor light-emitting elements 150 may be transferred to the wiring substrate from the assembly substrate 161, thereby enabling a large-area transfer across a large area. Thus, the assembly substrate 161 may be referred to as a temporary substrate.

Meanwhile, the above-explained self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material may be placed on the semiconductor light-emitting elements so that the semiconductor light-emitting elements are moved by magnetic force, and the semiconductor light-emitting elements may be mounted at preset positions by an electric field in the process of being moved. This transfer method and device will be described in more detail below with reference to the accompanying drawings.

Figure 6:
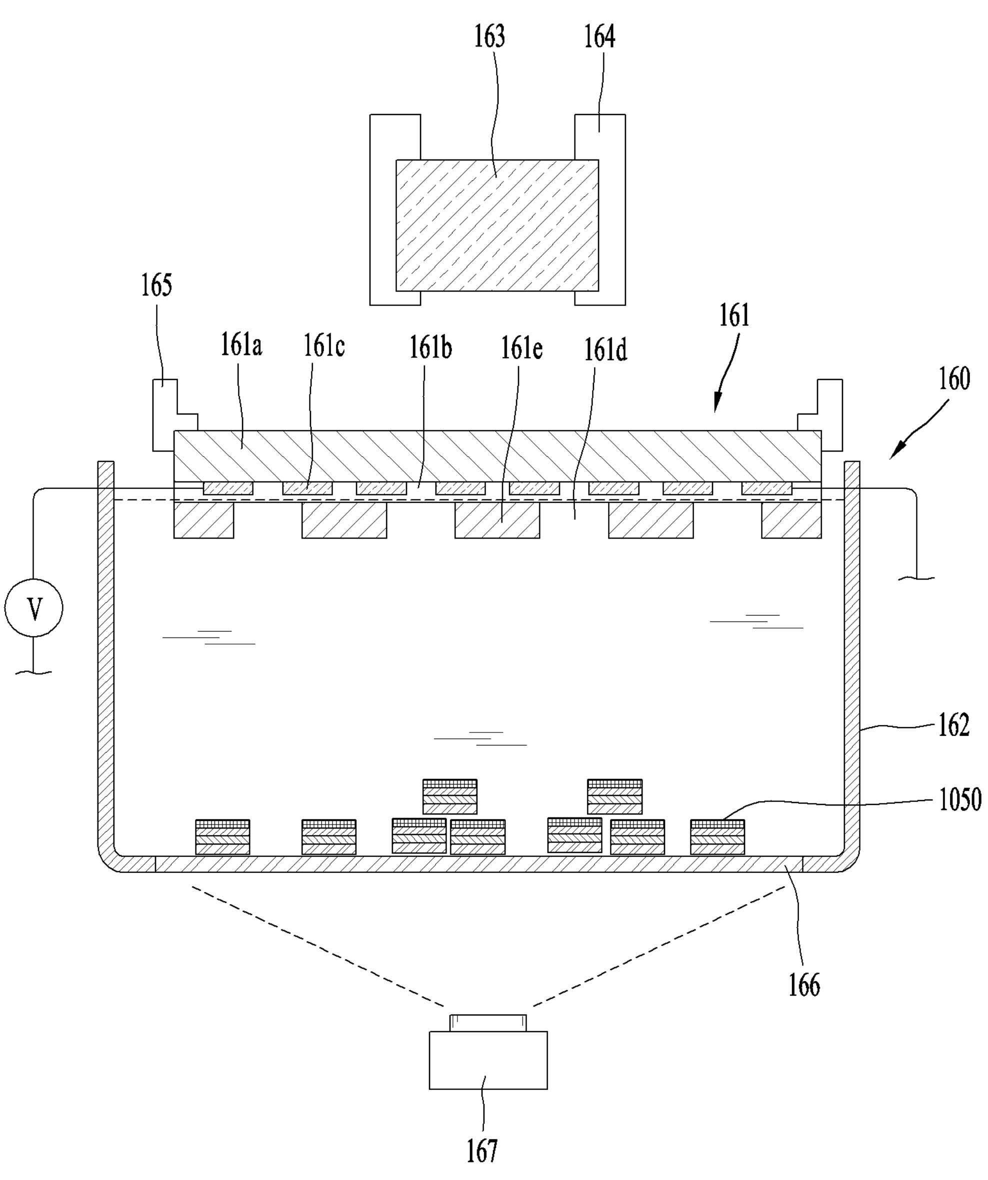
FIG. 6 is a conceptual diagram illustrating one embodiment of a device for self-assembling semiconductor light-emitting elements according to the present disclosure.
Figure 7:
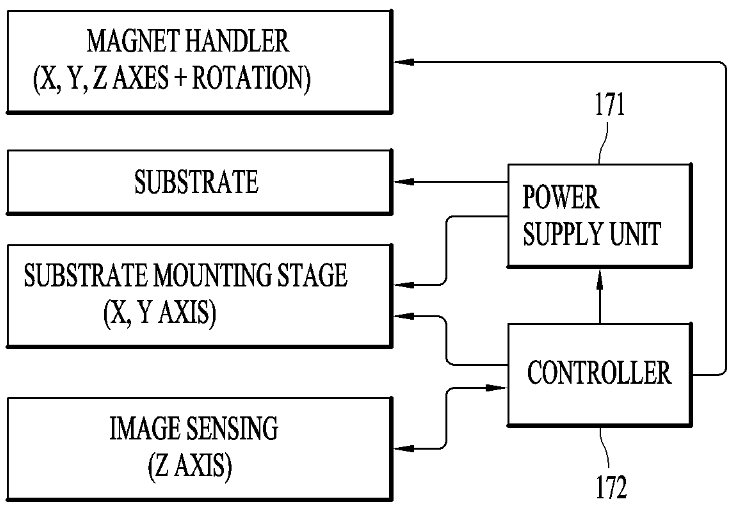
FIG. 7 is a block diagram of the self-assembly device of FIG. 6.

FIG. 6 is a conceptual diagram illustrating an example of a device for self-assembling semiconductor light-emitting elements and FIG. 7 is a block diagram of the self-assembly device of FIG. 6. FIGS. 8A to 8E are conceptual view illustrating a process for self-assembling semiconductor light-emitting elements using the self-assembly device of FIG. 6 and FIG. 9 is a conceptual view illustrating the semiconductor light-emitting element of FIGS. 8A to 8E.

Referring to FIGS. 6 and 7, the self-assembly device 160 may include a fluid chamber 162, a magnet 163, and a position controller 164.

The fluid chamber 162 may define a space for receiving a plurality of semiconductor light-emitting elements. The space may be filled with a fluid, and the fluid may be an assembly solution, which includes water or the like. Thus, the fluid chamber 162 may be a water tank and configured as an open-type. However, the present disclosure is not limited to this, and the fluid chamber 162 may be a closed-type chamber in which the space is in a closed state.

A substrate 161 may be placed in the fluid chamber 162 so that an assembly surface where the semiconductor light-emitting elements 150 are assembled faces downwards. For example, the substrate 161 may be fed to an assembly site by a feed unit (transfer unit), and the transfer unit may include a stage 165 where the substrate is mounted. The position of the stage 165 may be adjusted by the controller, whereby the substrate 161 can be fed to the assembly site.

In this instance, the assembly surface of the substrate 161 at the assembly site may face the bottom of the fluid chamber 162. As illustrated in the drawings, the assembly surface of the substrate 161 may be placed to be soaked with the fluid in the fluid chamber 162. Thus, the semiconductor light-emitting elements 150 in the fluid may be moved to the assembly surface.

The substrate 161 may be an assembly substrate where an electric field can be formed, and may include a base portion 161$a$, a dielectric layer 161$b$, and a plurality of electrodes 161$c$.

The base portion 161$a$ may be made of an insulating material, and the plurality of electrodes 161$c$ may be thin-film or thick-film bi-planar electrodes that are patterned on one surface of the base portion 161$a$. The electrodes 161$c$ may be formed of a stack of Ti/Cu/Ti, Ag paste, ITO, etc.

The dielectric layer 161$b$ may be made of an inorganic material such as SiO2, SiNx, SiON, Al2O3, TiO2, HfO2, etc. Alternatively, the dielectric layer 161$b$ may be an organic insulator and configured as a single layer or a multi-layer. The thickness of the dielectric layer 161$b$ may range from several tens of nm to several μm.

Further, the substrate 161 according to the present disclosure includes a plurality of cells 161$d$ that are separated by barrier walls. The cells 161$d$ may be sequentially arranged in one direction and made of a polymer material. Furthermore, the barrier walls 161$e$ defining the cells 161$d$ may be made to be shared with neighboring cells 161$d$. The barrier walls 161$e$ may protrude from the base portion 161$a$, and the cells 161$d$ may be sequentially arranged in one direction by the barrier walls 161$e$. More specifically, the cells 161$d$ may be sequentially arranged in column and row directions and have a matrix configuration.

As illustrated in the drawings, the cells 161$d$ may have recesses for receiving the semiconductor light-emitting elements 150, and the recesses may be spaces defined by the barrier walls 161$e$. The recesses may have a shape identical or similar to the shape of the semiconductor light-emitting elements. For example, if the semiconductor light-emitting elements are rectangular, the recesses may be rectangular too. Moreover, although not shown, the recesses formed in the cells may be circular if the semiconductor light-emitting elements are circular. Also, each of the cells is configured to accommodate a single semiconductor light-emitting element. In other words, a single semiconductor light-emitting element is accommodated in a single cell.

Meanwhile, the plurality of electrodes 161*c* may have a plurality of electrode lines that are placed on bottoms of the cells 161*d*, and the plurality of electrode lines may extend to neighboring cells.

The plurality of electrodes 161*c* may be placed beneath the cells 161*d*, and different polarities may be applied to create an electric field within the cells 161*d*. To form an electric field, the dielectric layer 161*b* may form the bottom of the cells 161*d* while covering the electrodes 161*c*. With this structure, when different polarities are applied to a pair of electrodes 161*c* beneath each cell 161*d*, an electric field may be formed and the semiconductor light-emitting elements can be inserted into the cells 161*d* by the electric field.

The electrodes of the substrate 161 at the assembly site may be electrically connected to a power supply 171. The power supply unit 171 may perform the function of generating the electric field by applying power to the electrodes.

As shown in the drawings, the self-assembly device may have the magnet 163 for applying magnetic force to the semiconductor light-emitting elements. The magnet 163 may be disposed at a distance from the fluid chamber 162 to apply magnetic force to the semiconductor light-emitting elements 150. The magnet 163 may be disposed to face an opposite side of the assembly surface of the substrate 161, and the position of the magnet 163 may be controlled by the position controller 164 connected to the magnet 163.

The semiconductor light-emitting elements 1050 may have a magnetic material so that they can be moved within the fluid by a magnetic field.

Referring to FIG. 9, a semiconductor light-emitting element having a magnetic material may include a first conductive electrode 1052, a second conductive electrode 1056, a first conductive semiconductor layer 1053 on which the first conductive electrode 1052 is disposed, a second conductive semiconductor layer 1055 which overlaps the first conductive semiconductor layer 1052 and on which the second conductive electrode 1056 is disposed, and an active layer 1054 disposed between the first and second conductive semiconductor layers 1053 and 1055.

Here, the first conductive may refer to p-type, and the second conductive type may refer to n-type, or vice versa. As stated previously, the semiconductor light-emitting element may be formed without the active layer.

Meanwhile, the first conductive electrode 1052 may be formed after the semiconductor light-emitting element is assembled onto the wiring substrate by the self-assembling of the semiconductor light-emitting element. Further, the second conductive electrode 1056 may include a magnetic material. The magnetic material may refer a magnetic metal. The magnetic material may be Ni, SmCo, etc. In another example, the magnetic material may include at least one of Gd-based, La-based, and Mn-based materials.

The magnetic material may be provided in the form of particles on the second conductive electrode 1056. Alternatively, one layer of a conductive electrode including a magnetic material may be made of the magnetic material. As an example, the second conductive electrode 1056 of the semiconductor light-emitting element 1050 may include a first layer 1056*a* and a second layer 1056*b*, as illustrated in FIG. 9. Here, the first layer 1056*a* may include a magnetic material, and the second layer 1056*b* may include a metal material other than the magnetic material.

As illustrated in the drawing, in this example, the first layer 1056*a* including the magnetic material may be disposed in contact with the second conductive semiconductor layer 1055. In this case, the first layer 1056*a* may be disposed between the second layer 1056*b* and the second conductive semiconductor layer 1055. The second layer 1056*b* may be a contact metal that is connected to the second electrode on the wiring substrate. However, the present disclosure is not necessarily limited to this, and the magnetic material may be disposed on one surface of the first conductive semiconductor layer.

Still referring to FIGS. 6 and 7, more specifically, on top of the fluid chamber of the self-assembly device, a magnet handler capable of automatically or manually moving the magnet 163 on the x, y, and z axes or a motor capable of rotating the magnet 163 may be provided. The magnet handler and motor may constitute the position controller 164. As such, the magnet 163 may rotate in a horizontal, clockwise, or counterclockwise direction with respect to the substrate 161.

Meanwhile, the fluid chamber 162 may be provided with a light-transmissive bottom plate 166, and the semiconductor light-emitting elements may be disposed between the bottom plate 166 and the substrate 161. An image sensor 167 may be disposed to face the bottom plate 166 so as to monitor the inside of the fluid chamber 162 through the bottom plate 166. The image sensor 167 may be controlled by a controller 172, and may include an inverted-type lens, CCD, etc. so as to observe the assembly surface of the substrate 161.

The self-assembly device may be configured to use a magnetic field and an electric field in combination. With this, the semiconductor light-emitting elements can be mounted at preset positions on the substrate by the electric field while being moved by changes in the position of the magnet. Hereinafter, the assembly process using the self-assembly device will be described in more detail.

First of all, a plurality of semiconductor light-emitting elements 1050 having a magnetic material may be formed through the process explained with reference to FIGS. 5A to 5C. In this case, the magnetic material may be deposited onto the semiconductor light-emitting elements in the process of forming the second conductive electrode of FIG. 5C.

Figure 8A:
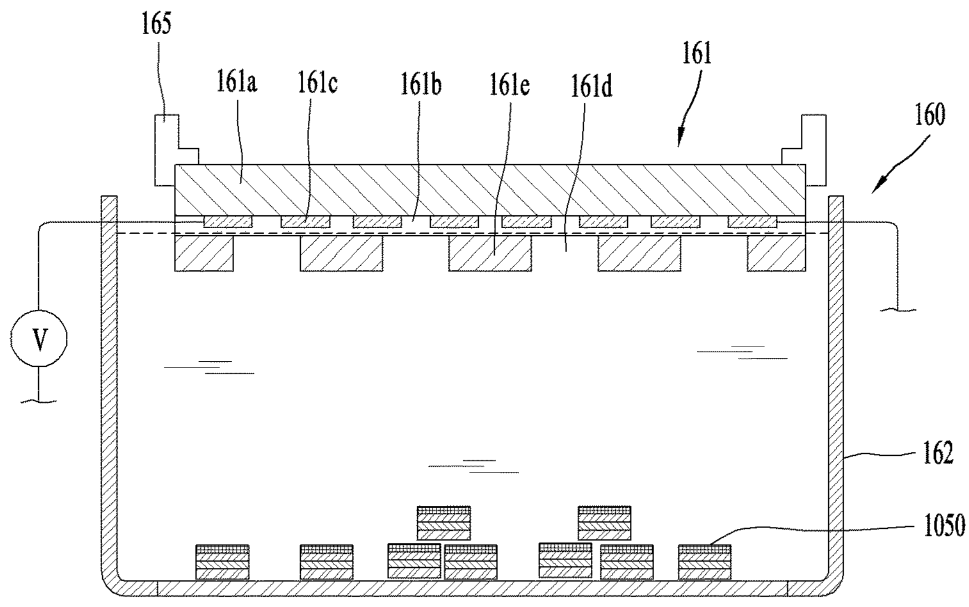
FIGS. 8A to 8E are conceptual views illustrating a process for self-assembling semiconductor light-emitting elements using the self-assembly device of FIG. 6.
Figure 9:
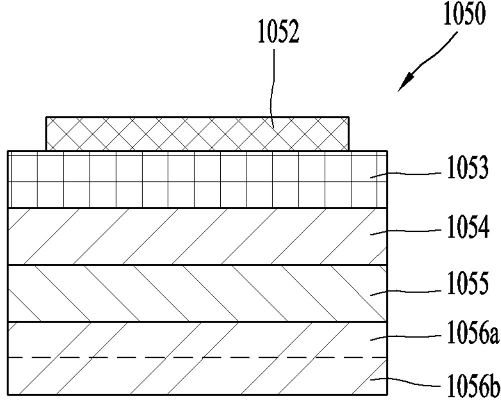
FIG. 9 is a view illustrating one embodiment of a semiconductor light-emitting element that is used in the self-assembly process of FIGS. 8A to 8E.

Next, the substrate 161 may be fed to an assembly site, and the semiconductor light-emitting elements 1050 may be put into the fluid chamber 162 (FIG. 8A).

As described above, the assembly site on the substrate 161 may be a position at which the substrate 161 is placed in the fluid chamber 162 in such a way that an assembly surface where the semiconductor light-emitting elements 150 are assembled faces downwards.

In this case, some of the semiconductor light-emitting elements 1050 may sink to the bottom of the fluid chamber 162 and some of them may float in the fluid. When the fluid chamber 162 is provided with the light-transmissive bottom plate 166, some of the semiconductor light-emitting elements 1050 may sink to the bottom plate 166.

Figure 8B:
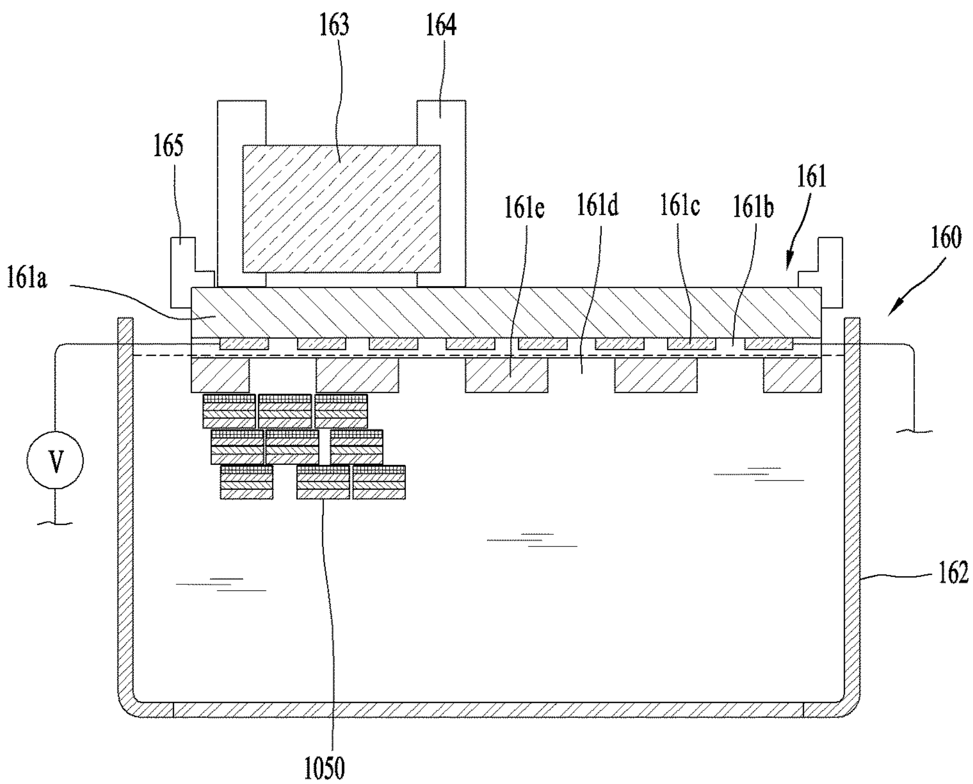

Next, magnetic force may be applied to the semiconductor light-emitting elements 1050 so that the semiconductor light-emitting elements 1050 in the fluid chamber 162 come up to the surface (FIG. 8B).

When the magnet 163 of the self-assembly device moves to the opposite side of the assembly surface of the substrate 161 from its original position, the semiconductor light-emitting elements 1050 may float in the fluid towards the substrate 161. The original position may refer to s position at which the magnet 163 is outside the fluid chamber 162. As another example, the magnet 163 may be configured as an electromagnet. In this case, an initial magnetic force may be generated by supplying electricity to the electromagnet.

Meanwhile, in this embodiment, the spacing between the assembly surface of the substrate 161 and the semiconductor light-emitting elements 1050 may be controlled by adjusting strength of the magnetic force. For example, the spacing may be controlled by using weight, buoyancy, and magnetic force of the semiconductor light-emitting elements 1050. The spacing may be several millimeters to several tens of micrometers from the outermost part of the substrate 161.

Figure 8C:
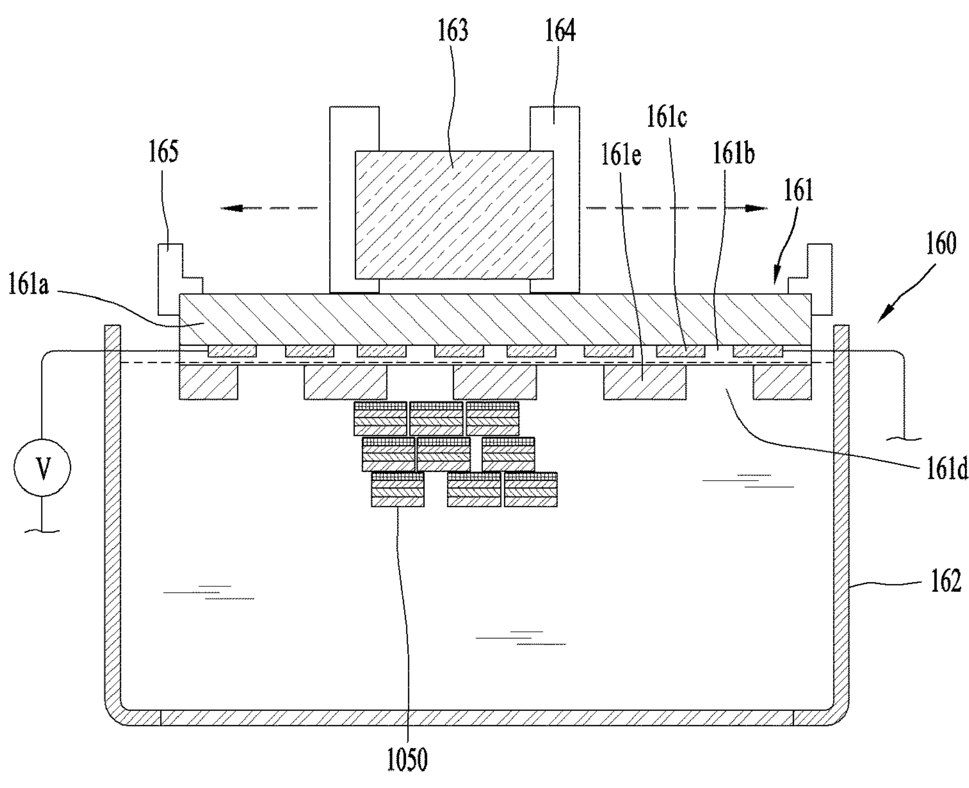

Next, magnetic force may be applied to the semiconductor light-emitting elements 1050 so that the semiconductor light-emitting elements 1050 can move in one direction within the fluid chamber 162. For example, the magnet 163 may move in a horizontal direction to the substrate, a clockwise direction, or a counterclockwise direction (FIG. 8C). In this case, the semiconductor light-emitting elements 1050 may be moved horizontally with respect to the substrate 161 by the magnetic force, with being spaced apart from the substrate 161.

Next, the semiconductor light-emitting elements 1050 may be guided to preset positions on the substrate 161 by applying an electric field so that the semiconductor light-emitting elements 1050 are mounted at the preset positions during their movement (FIG. 8C). For example, the semiconductor light-emitting elements 1050 may be moved vertically with respect to the substrate 161 by the electric field while being moved horizontally with respect to the substrate 161, thereby being placed at the preset positions of the substrate 161.

More specifically, an electric field may be generated by supplying power to bi-planar electrodes on the substrate 161, and the semiconductor light-emitting electrodes 1050 may be guided to be assembled only at the preset positions by the electric field. That is, the semiconductor light-emitting elements 1050 may be self-assembled at the assembly site on the substrate 161 by a selectively generated electric field. To this end, the substrate 161 may be provided with cells into which the semiconductor light-emitting elements 1050 are fitted.

Afterwards, unloading of the substrate 161 may be performed, thereby completing the assembly process. In a case where the substrate 161 is an assembly substrate, the assembled semiconductor light-emitting elements may be transferred onto a wiring substrate to carry out a subsequent process for realizing the display device, as described previously.

Figure 8D:
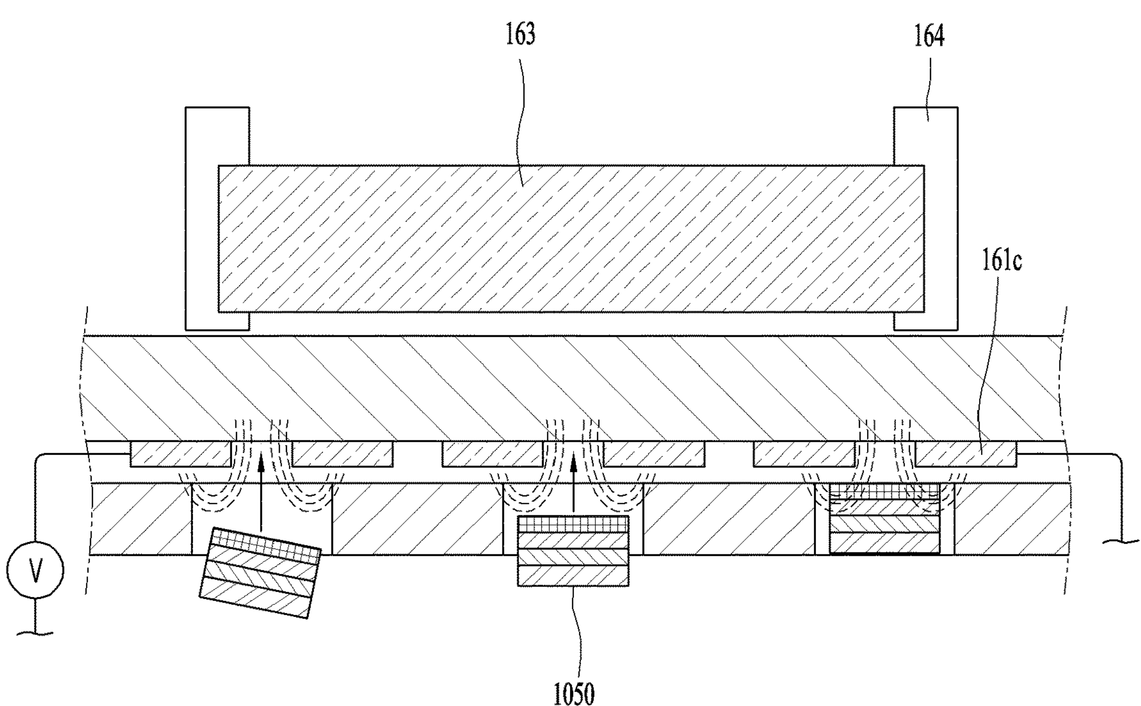
Figure 8E:
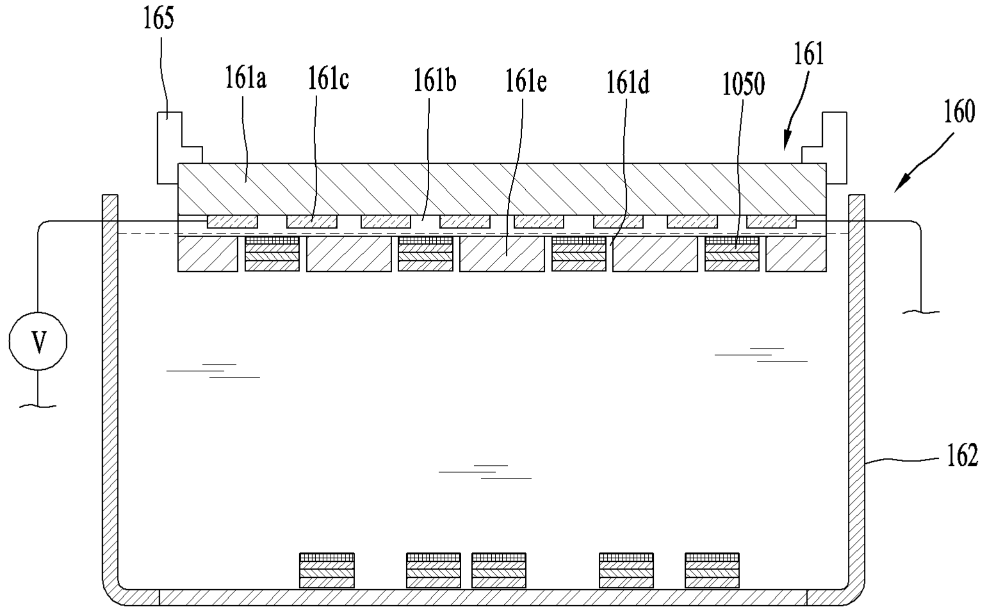

Meanwhile, after the semiconductor light-emitting elements 1050 are guided to the preset positions, the magnet 163 may be moved away from the substrate 161 such that the semiconductor light-emitting elements 1050 remaining in the fluid chamber 162 fall to the bottom of the fluid chamber 162 (FIG. 8D). In another example, when power supply is stopped in a case where the magnet 163 is an electromagnet, the semiconductor light-emitting elements 1050 remaining in the fluid chamber 162 may fall to the bottom of the fluid chamber 162.

Thereafter, the semiconductor light-emitting elements 1050 on the bottom of the fluid chamber 162 may be collected, and the collected semiconductor light-emitting elements 1050 may be re-used.

In the above-explained self-assembly device and method, parts at far distances may be concentrated near a preset assembly site by using a magnetic field in order to increase assembly yields in a fluidic assembly, and guided to be selectively assembled only at the assembly site by applying an electric field to the assembly site. In this case, the assembly substrate may be positioned on top of a water tank, with its assembly surface facing downward, thereby minimizing the effect of gravity from the weights of the parts and avoiding non-specific binding and eliminating defects. That is, the assembly substrate may be placed on the top to increase transfer yields, thus minimizing the effect of gravity or friction and avoiding non-specific binding.

As seen from above, with the configuration, a large number of semiconductor light-emitting elements can be assembled at a time in a display device where individual pixels are made up of semiconductor light-emitting elements.

As such, a large number of semiconductor light-emitting elements can be pixelated on a small-sized wafer and then transferred onto a large-area substrate. This enables the manufacture of a large-area display device at a low cost.

Meanwhile, the present disclosure provides a structure and method of an assembly substrate for increasing the yields of the self-assembly process and the process yields after the self-assembly. The present disclosure is limited to a case where the substrate 161 is used as an assembly substrate. That is, the assembly substrate to be described later is not used as the wiring substrate of the display device. Hereinafter, the substrate 161 is referred to as an assembly substrate 161.

The present disclosure improves the process yields in two respects. First, the present disclosure prevents semiconductor light-emitting elements from being mounted on undesired positions due to an electric field strongly formed at the undesired positions. Second, the present disclosure suppresses the semiconductor light-emitting elements from remaining on the assembly substrate when transferring the semiconductor light-emitting elements mounted on the assembly substrate to another substrate.

The above-mentioned objectives are not individually achieved by different components. The above-described two objectives can be achieved by organic coupling of components to be described later and the assembly substrate 161 described above.

Before describing the present disclosure in detail, a post-process for manufacturing a display device after self-assembling will be described.

Figure 10A:
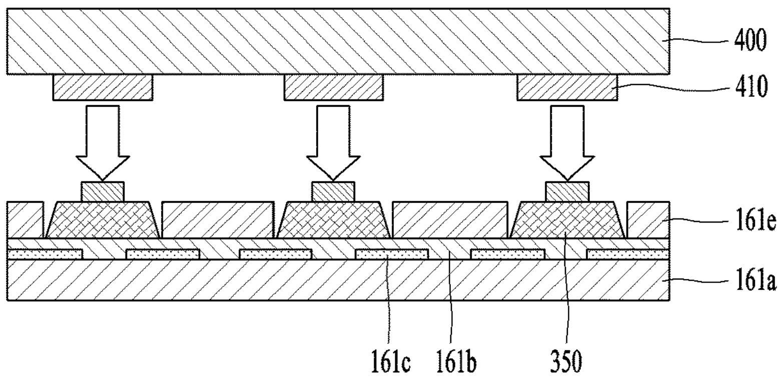
FIGS. 10A to 10C are conceptual views illustrating another transfer process of semiconductor light-emitting elements after a self-assembly process according to the present disclosure.
Figure 10B:
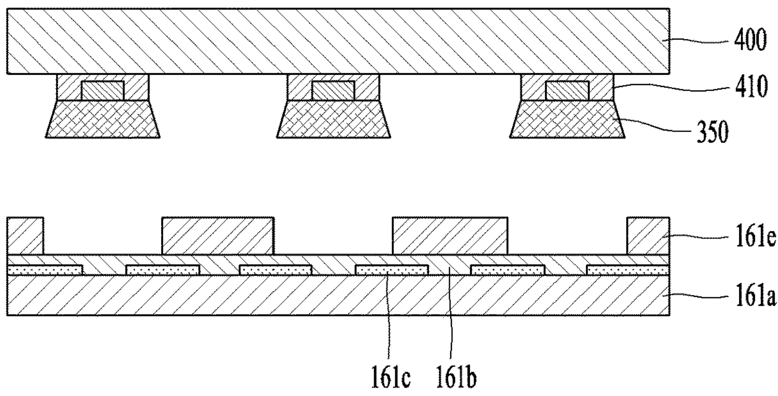
Figure 10C:
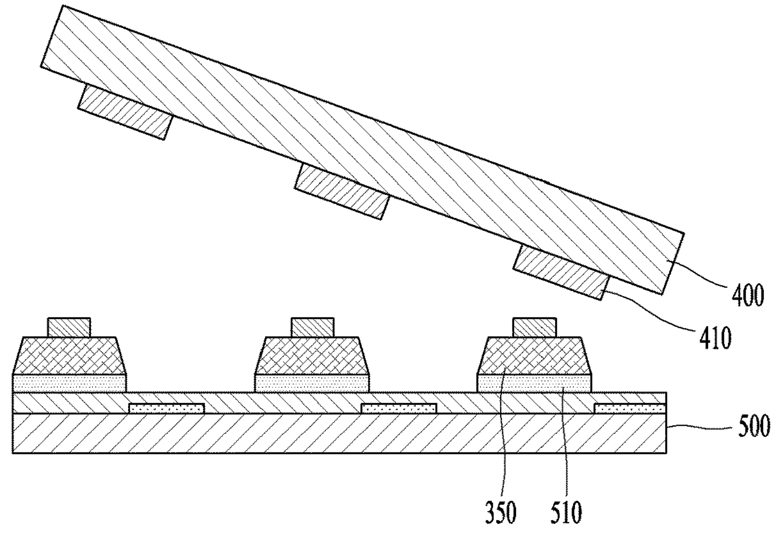

FIGS. 10A to 10C are conceptual diagrams illustrating a state in which the semiconductor light-emitting elements are transferred after a self-assembling process according to the present disclosure.

When the self-assembly process described with reference to FIGS. 8A to 8E is completed, the semiconductor light-emitting elements are mounted on the assembly substrate 161 at preset positions. The semiconductor light-emitting elements mounted on the assembly substrate 161 are transferred at least once to another substrate. This specification illustrates one embodiment in which the semiconductor light-emitting elements mounted on the assembly substrate 161 are transferred twice, but the present disclosure is not limited thereto. The semiconductor light-emitting elements mounted on the assembly substrate 161 may be transferred to another substrate once or three times or more.

On the other hand, immediately after the self-assembly process is completed, the assembly surface of the assembly substrate 161 faces downwards (or the gravity direction).

For the process after the self-assembly, the assembly substrate 161 may be turned by 180 degrees with the semiconductor light-emitting elements mounted thereon. In this process, there is a risk that the semiconductor light-emitting elements are likely to be separated from the assembly substrate 161. Therefore, a voltage must be applied to the plurality of electrodes 161*c* (hereinafter, referred to as assembly electrodes) while the assembly substrate 161 is turned. An electric field formed between the assembly electrodes prevents the semiconductor light-emitting elements from being separated from the assembly substrate 161 while the assembly substrate 161 is turned.

When the assembly substrate 161 is turned by 180 degrees after the self-assembly process, a shape as shown in FIG. 10A is made. Specifically, as shown in FIG. 10A, the assembly surface of the assembly substrate 161 is in a state of facing upwards (or the opposite direction to gravity). In this state, a transfer substrate 400 is aligned above the assembly substrate 161.

The transfer substrate 400 is a substrate for separating the semiconductor light-emitting elements placed on the assembly substrate 161 and transferring them to the wiring substrate. The transfer substrate 400 may be formed of PDMS (polydimethylsiloxane). Accordingly, the transfer substrate 400 may be referred to as a PDMS substrate.

The transfer substrate 400 is aligned above the assembly substrate 161 and then pressed onto the assembly substrate 161. When the transfer substrate 400 is fed above the assembly substrate 161, the semiconductor light-emitting elements 350 mounted on the assembly substrate 161 are transferred to the transfer substrate 400 by the adhesive force of the transfer substrate 400.

To this end, surface energy between the semiconductor light-emitting elements 350 and the transfer substrate 400 should be higher than surface energy between the semiconductor light-emitting elements 350 and the dielectric layer 161*b*. When there is a greater difference between the surface energy between the semiconductor light-emitting elements 350 and the transfer substrate 400 and the surface energy between the semiconductor light-emitting elements 350 and the dielectric layer 161*b*, the probability that the semiconductor light-emitting elements 350 are separated from the assembly substrate 161 is more increased. Therefore, it is preferable that the difference between the two surface energies is great.

Meanwhile, the transfer substrate 40 may include a plurality of protrusions 410 that allow pressure applied by the transfer substrate 400 to be concentrated on the semiconductor light-emitting elements 350 when pressing the transfer substrate 400 onto the assembly substrate 161. The protrusions 410 may be formed at the same interval as the semiconductor light-emitting elements mounted on the assembly substrate 161. When the transfer substrate 400 is pressed onto the assembly substrate 161 after the protrusions 410 are aligned to overlap the semiconductor light-emitting elements 350, the pressure applied by the transfer substrate 400 can be concentrated only on the semiconductor light-emitting elements 350. Thus, the present disclosure increases the probability that the semiconductor light-emitting elements are separated from the assembly substrate 161.

Meanwhile, in a state where the semiconductor light-emitting elements are mounted on the assembly substrate 161, parts of the semiconductor light-emitting elements are preferably exposed to the outside of recesses. If the semiconductor light-emitting elements 350 are not exposed to the outside of the recesses, the pressure applied by the transfer substrate 400 is not concentrated on the semiconductor light-emitting elements 350, which may lower the probability that the semiconductor light-emitting elements 350 are separated from the assembly substrate 161.

Lastly, referring to FIG. 10C, the step of pressing the transfer substrate 400 onto the wiring substrate 500 and transferring the semiconductor light-emitting elements 350 from the transfer substrate 400 to the wiring substrate 500 is carried out. At this time, the wiring substrate 500 may be provided with protrusions 510. The transfer substrate 400 and the wiring substrate 500 are aligned so that the semiconductor light-emitting elements 350 disposed on the transfer substrate 400 overlap the protrusions 510. Thereafter, when the transfer substrate 400 is pressed onto the wiring substrate 500, the probability that the semiconductor light-emitting elements 350 are separated from the transfer substrate 400 may increase due to the protrusions 510.

On the other hand, in order for the semiconductor light-emitting elements 350 disposed on the transfer substrate 400 to be transferred to the wiring substrate 500, surface energy between the semiconductor light-emitting elements 350 and the wiring substrate 500 should be higher than surface energy between the semiconductor light-emitting elements 350 and the transfer substrate 400. When there is a greater difference between the surface energy between the semiconductor light-emitting elements 350 and the wiring substrate 500 and the surface energy between the semiconductor light-emitting elements 350 and the transfer substrate 400, the probability that the semiconductor light-emitting elements 350 are separated from the transfer substrate 400 is more increased. Therefore, it is preferable that the difference between the two surface energies is great.

After all the semiconductor light-emitting elements 350 disposed on the transfer substrate 400 are transferred onto the wiring substrate 500, the step of establishing electrical connection between the semiconductor light-emitting elements 350 and wiring electrodes provided on the wiring substrate may be performed. The structure of the wiring electrodes and the method of establishing the electrical connection may vary depending on the type of the semiconductor light-emitting elements 350.

Although not shown, an anisotropic conductive film may be disposed on the wiring substrate 500. In this case, the electrical connection can be established between the semiconductor light-emitting elements 350 and the wiring electrodes formed on the wiring substrate 500, simply by pressing the transfer substrate 400 onto the wiring substrate 500.

On the other hand, when manufacturing a display device including semiconductor light-emitting elements emitting light of different colors, the method described in FIGS. 10A to 10C can be implemented in various ways. Hereinafter, a method for manufacturing a display device including semiconductor light-emitting elements that emit red (R), green (G), and blue (B) light will be described.

Figure 11:
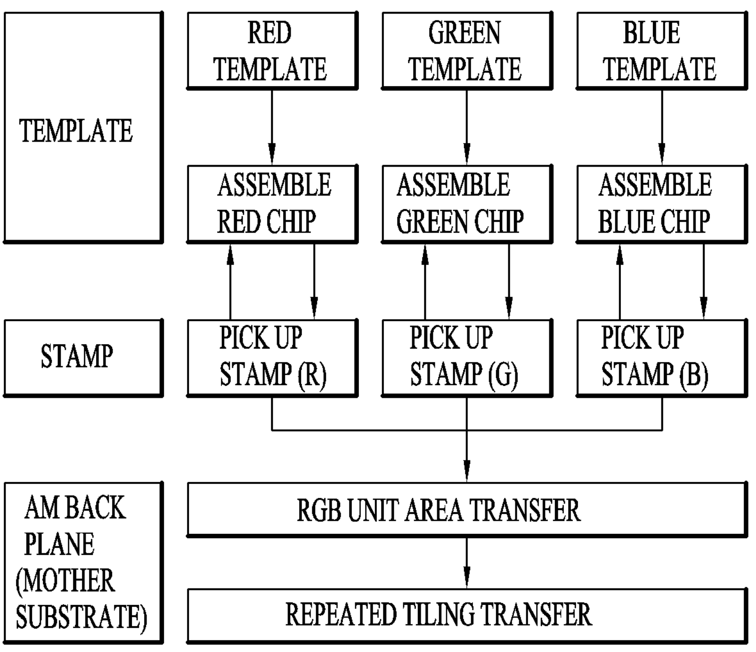
FIGS. 11 to 13 are flowcharts illustrating a method for manufacturing a display device including semiconductor light-emitting elements that emit red (R), green (G), and blue (B) light.
Figure 12:
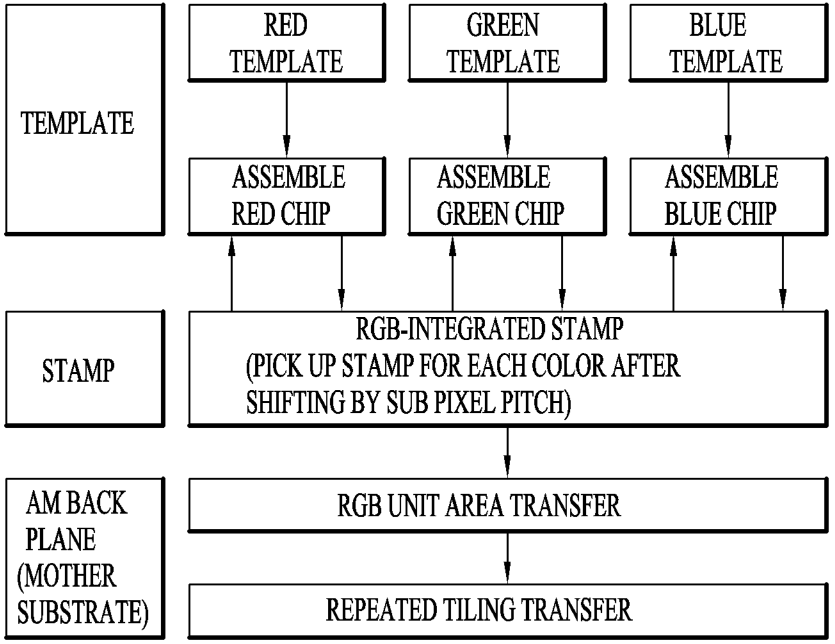
Figure 13:
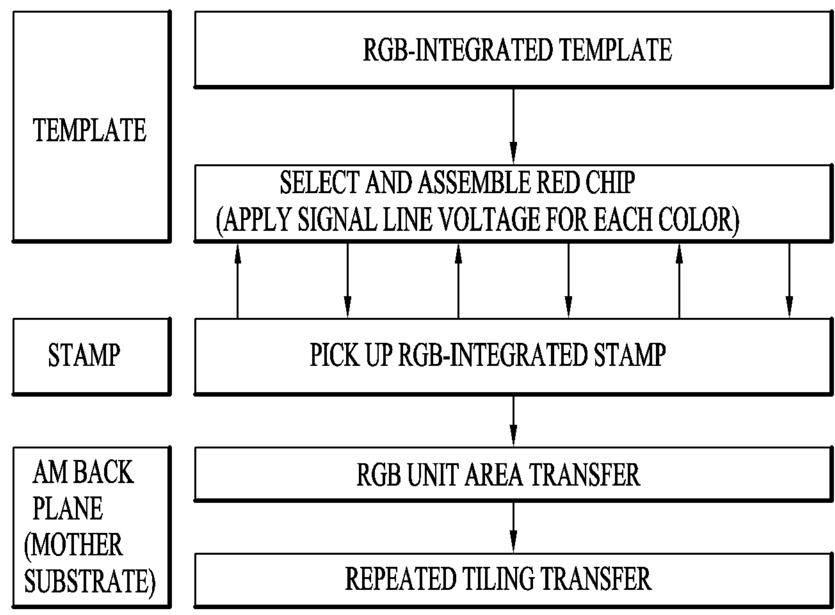

FIGS. 11 to 13 are flowcharts illustrating a method for manufacturing a display device including semiconductor light-emitting elements that emit red (R), green (G), and blue (B) light.

Semiconductor light-emitting elements emitting light of different colors may be individually assembled to different assembly substrates. Specifically, the assembly substrate 161 may include a first assembly substrate on which semiconductor light-emitting elements emitting light of a first color are mounted, a second assembly substrate on which semiconductor light-emitting elements emitting light of a second color different from the first color are mounted, and a third assembly substrate on which semiconductor light-emitting elements emitting light of a third color different from the first color and the second color are mounted. Different kinds of semiconductor light-emitting elements are assembled to assembly substrates, respectively, according to the method described in FIGS. 8A to 8E. For example, semiconductor light-emitting elements emitting red (R), green (G), and blue (B) light may be assembled to the first to third assemble substrates, respectively.

Referring to FIG. 11, a RED chip, a GREEN chip, and a BLUE chip may be assembled respectively to first to third assembly substrates RED TEMPLATE, GREEN TEMPLATE, and BLUE TEMPLATE. In this state, the RED chip, GREEN chip and BLUE chip may be transferred to the wiring substrate by different transfer substrates, respectively.

Specifically, the step of transferring the semiconductor light-emitting elements, which are mounted on the assembly substrate, to the wiring substrate may include pressing a first transfer substrate (stamp R) onto the first assembly substrate RED TEMPLATE to transfer the semiconductor light-emitting elements (RED chip) emitting the light of first color from the first assembly substrate RED TEMPLATE to the first transfer substrate (stamp R), pressing a second transfer substrate (stamp G) onto the second assembly substrate GREEN TEMPLATE to transfer semiconductor light-emitting elements (GREEN chip) emitting the light of second color from the second assembly substrate GREEN TEMPLATE to the second transfer substrate (stamp G), and pressing a third transfer substrate (stamp B) onto the third assembly substrate BLUE TEMPLATE to transfer semiconductor light-emitting elements (BLUE chip) emitting the light of third color from the third assembly substrate BLUE TEMPLATE to the third transfer substrate (stamp B).

Thereafter, the step of pressing the respective first to third transfer substrates onto the wiring substrate to transfer the semiconductor light-emitting elements emitting the light of first to third colors from the first to third transfer substrates to the wiring substrate, respectively.

According to the manufacturing method according to FIG. 11, three types of assembly substrates and three types of transfer substrates are required to manufacture a display device including a RED chip, a GREEN chip, and a BLUE chip.

On the contrary, referring to FIG. 12, the RED chip, the GREEN chip, and the BLUE chip may be assembled to the first to third assembly substrates RED TEMPLATE, GREEN TEMPLATE, and BLUE TEMPLATE, respectively. In this state, the RED chip, GREEN chip and BLUE chip may be transferred to the wiring substrate by the same transfer substrate.

Specifically, the step of transferring the semiconductor light-emitting elements, which are mounted on the assembly substrate, to the wiring substrate may include pressing a transfer substrate (RGB integrated stamp) onto the first assembly substrate RED TEMPLATE to transfer the semiconductor light-emitting elements (RED chip) emitting the light of first color from the first assembly substrate RED TEMPLATE to the transfer substrate (RGB integrated stamp), pressing the transfer substrate (RGB integrated stamp) onto the second assembly substrate GREEN TEMPLATE to transfer semiconductor light-emitting elements (GREEN chip) emitting the light of second color from the second assembly substrate GREEN TEMPLATE to the transfer substrate (RGB integrated stamp), and pressing the transfer substrate (RGB integrated stamp) onto the third assembly substrate BLUE TEMPLATE to transfer semiconductor light-emitting elements (BLUE chip) emitting the light of third color from the third assembly substrate BLUE TEMPLATE to the transfer substrate (RGB integrated stamp).

In this case, the alignment positions between each of the first to third assembly substrates and the transfer substrate may be different from each other. For example, when the alignment between the assembly substrates and the transfer substrate is completed, the relative position of the transfer substrate with respect to the first assembly substrate and the relative position of the transfer substrate with respect to the second assembly substrate may be different from each other. The transfer substrate may be shifted in its alignment position by a pitch of a sub pixel every time the type of the assembly substrate is changed. In this way, when the transfer substrate is sequentially pressed onto the first to third assembly substrates, all the three kinds of chips can be transferred to the transfer substrate.

Afterwards, similar to FIG. 11, the step of pressing the transfer substrate onto the wiring substrate to transfer the semiconductor light-emitting elements emitting the light of first to third colors from the transfer substrate to the wiring substrate is performed.

According to the manufacturing method illustrated in FIG. 12, three types of assembly substrates and one type of transfer substrate are required to manufacture a display device including an RED chip, a GREEN chip, and a BLUE chip.

Unlike FIGS. 11 and 12, according to FIG. 13, a RED chip, a GREEN chip, and a BLUE chip may be assembled onto one assembly substrate (RGB integrated TEMPLATE). In this state, each of the RED chip, GREEN chip and BLUE chip can be transferred to the wiring substrate by the same transfer substrate (RGB integrated stamp).

According to the manufacturing method illustrated in FIG. 13, one type of assembly substrate and one type of transfer substrate are required to manufacture a display device including an RED chip, a GREEN chip, and a BLUE chip.

As described above, when manufacturing a display device including semiconductor light-emitting elements emitting light of different colors, the manufacturing method may be implemented in various ways.

The present disclosure provides a display device in which red, green, and blue semiconductor light-emitting elements constitute one pixel. In the present disclosure, the red, green, and blue semiconductor light-emitting elements constituting the display device may be manufactured to be simultaneously assembled. In particular, the red and blue light-emitting elements have different structures in a vertical direction while maintaining a circular shape in a horizontal direction, which can provide assembly selectivity while being advantageous in terms of assembly speed and assembly yield.

In the present disclosure, a display device driven in an active matrix (AM) manner will be described. However, unlike this, the display device according to the present disclosure may also be driven in a passive matrix (PM) manner.

Figure 14:
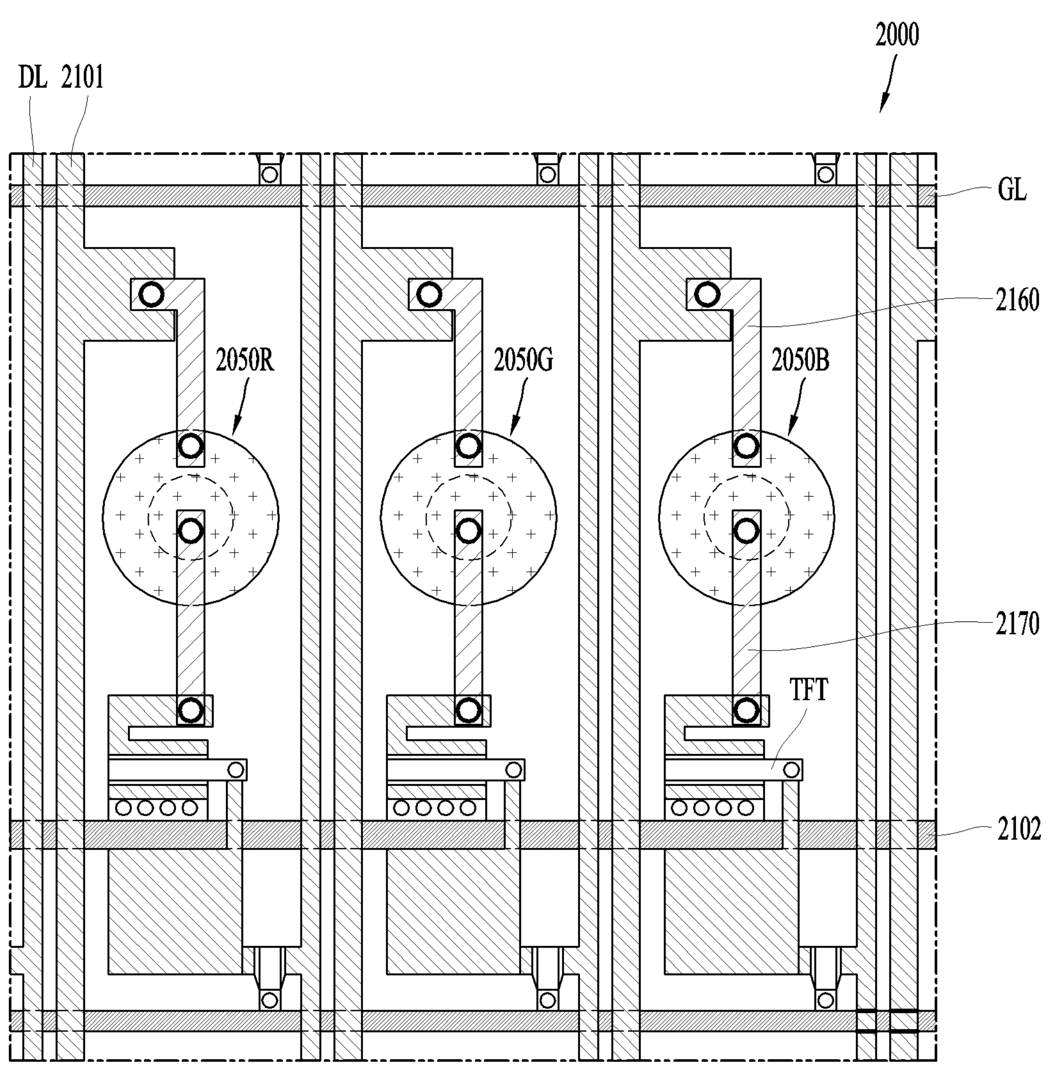
FIG. 14 is a view illustrating a pixel area of a display device in accordance with one embodiment of the present disclosure.
Figure 15:
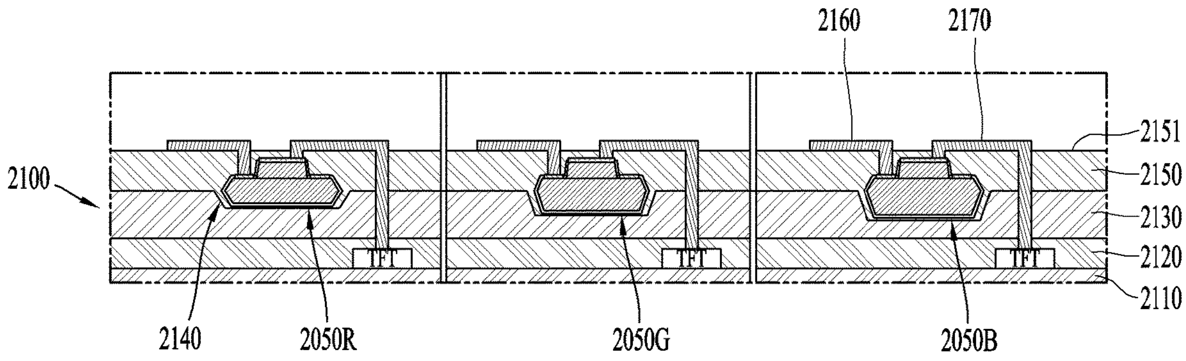
FIG. 15 is a cross-sectional view of a sub-pixel area of FIG. 14.

FIG. 14 is a view illustrating a pixel area of a display device in accordance with one embodiment of the present disclosure, and FIG. 15 is a cross-sectional view of a sub-pixel area of FIG. 14.

The display device 2000 according to the present disclosure may include a red semiconductor light-emitting element 2050R, a green semiconductor light-emitting element 2050G, and a blue semiconductor light-emitting element 2050B, which may constitute one pixel.

In the present disclosure, the red semiconductor light-emitting element 2050R, the green semiconductor light-emitting element 2050G, and the blue semiconductor light-emitting element 2050B may be disposed on a substrate 2100. Components involved in driving (or turning on) the semiconductor light-emitting elements 2050R, 2050G, and 2050B described above may be disposed on the substrate 2100.

A bottom surface of the substrate 2100 may be a base portion 2110, and the base portion 2110 may be made of a material such as glass, sapphire, silicon, polymer, or the like. Among those materials, when the base portion 2110 is made of a polymer material, the substrate 2100 may be a flexible substrate. For example, the polymer material is a flexible and insulating material, and may be polyimide (PI), polyethylene naphthalate (PEN), polyethylene terephthalate (PET), and the like.

The base portion 2110 may include thin film transistors (TFTs) involved in driving the semiconductor light-emitting elements 2050R, 2050G, 2050B, specifically, a switching thin film transistor and a driving thin film transistor. The thin film transistors TFT may be disposed to correspond to the semiconductor light-emitting elements 1150 in a one-to-one manner, and may perform control in units of individual semiconductor light-emitting elements.

On the base portion 2110, gate electrodes GL and data electrodes DL configured as a plurality of lines for electrical connection between the semiconductor light-emitting elements 2050R, 2050G, and 2050B and the thin film transistors TFT may be disposed on the base portion 2110. The gate electrodes GL and the data electrodes DL may extend in directions crossing each other. In addition, individual electrodes 2101 and common electrodes 2102 may be disposed on the base portion 2110 to supply driving power to the semiconductor light-emitting elements 2050R, 2050G, and 2050B. In addition to these components, other components for driving the above-described semiconductor light-emitting elements 2050R, 2050G, and 2050B may be necessarily or selectively disposed on the base portion 2110, and detailed descriptions of the components will be omitted herein.

Meanwhile, in the present disclosure, according to a method for manufacturing a display device 2000, components involved in assembling the above-described semiconductor light-emitting elements 2050R, 2050G, and 2050B may be selectively disposed on the base portion 2110.

The display device 2000 according to the present disclosure may be manufactured through the self-assembly method illustrated in FIGS. 8A to 8E. Self-assembly methods include a method of directly assembling the semiconductor light-emitting elements 2050R, 2050G, and 2050B to a final substrate to be used in a product (hereinafter, referred to as a direct transfer method), and a method of assembling the semiconductor light-emitting elements 2050R, 2050G, and 2050B onto an assembly substrate and transferring them to a final substrate using a transfer stamp (hereinafter, referred to as a hybrid method).

When the display device 2000 is manufactured by the direct transfer method, the semiconductor light-emitting elements 2050R, 2050G, and 2050B are directly self-assembled onto the substrate 2100. Therefore, assembly electrodes (not illustrated) may be included to form an electric field to hold the semiconductor light-emitting elements 2050R, 2050G, and 2050B. The assembly electrodes may be provided as a plurality of lines extending in one direction, and disposed to overlap receiving holes in which the semiconductor light-emitting elements are seated. However, even by using the direct transfer method, when an electrode other than the assembly electrode, for example, a common electrode is used as the assembly electrode, the substrate 2100 may not include the assembly electrode. On the other hand, when the display device 2000 is manufactured by the hybrid method, since the semiconductor light-emitting elements 2050R, 2050G, and 2050B are self-assembled on the assembly substrate, the substrate 2100 may not include the assembly electrodes.

Receiving holes 2140 in which the semiconductor light-emitting elements 2050R, 2050G, and 2050B are seated may be formed in the base portion 2110. The receiving holes 2140 may be formed in a different layer from a layer including the electrodes and thin film transistors disposed on the base portion 2110. For example, the receiving holes 2140 may be separated from the electrodes and the thin film transistor (TFT) by one or more insulating layers 2120 and 2130. The receiving holes 2140 may be concavely formed on the insulating layer 2130 to correspond to the semiconductor light-emitting elements seated therein. In this case, the receiving holes 2140 may have a wider width than the semiconductor light-emitting element so that the semiconductor light-emitting element can be seated therein.

The one or more insulating layers 2120 and 2130 may be formed of an inorganic or organic material. For example, the insulating layer may be formed of an inorganic insulating material or a polymer material such as silicon oxide (SiO2) and silicon nitride (SiNx), and an organic material such as benzocyclobutene or photo acryl. In addition, the one or more insulating layers 2120 and 2130 may be made of the same material or different materials.

In addition, a planarization layer 2150 may be disposed on the base portion 2110 to cover the semiconductor light-emitting elements 2050R, 2050G, and 2050B seated in the receiving holes 2140. The planarization layer 2150 may be formed of an insulating light-transmitting material, for example, photoresist, an optical polymer material, or other industrial plastic material.

The planarization layer 2150 may provide a flat surface 2151 on top of the semiconductor light-emitting elements 2050R, 2050G, and 2050B. Connection electrodes 2160 and 2170 that connect the semiconductor light-emitting elements 2050R, 2050G, and 2050B to the electrodes and TFT disposed on the base portion 2110 may be disposed on the flat surface 2151. The connection electrodes 2160 and 2170 may be formed by forming holes through a photolithography process to expose portions of the first conductive electrode and the second conductive electrode of the semiconductor light-emitting element and then filling the inside of the holes with a conductive material.

Meanwhile, in the display device 2000 according to the present disclosure, one pixel includes red, green, and blue semiconductor light-emitting elements 2050R, 2050G, and 2050B, which have mutually exclusive structures so as to be assembled simultaneously. Hereinafter, the structures of the semiconductor light-emitting elements 2050R, 2050G, and 2050B constituting the display device 2000 of the present disclosure will be described in detail.

Figure 16:
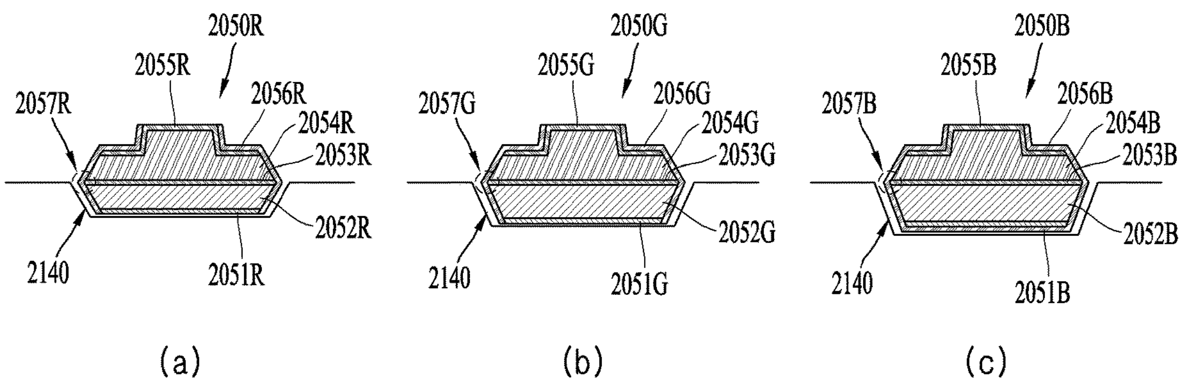
FIG. 16 is a conceptual view illustrating one embodiment of red, green, and blue semiconductor light-emitting elements according to the present disclosure.
Figure 17:
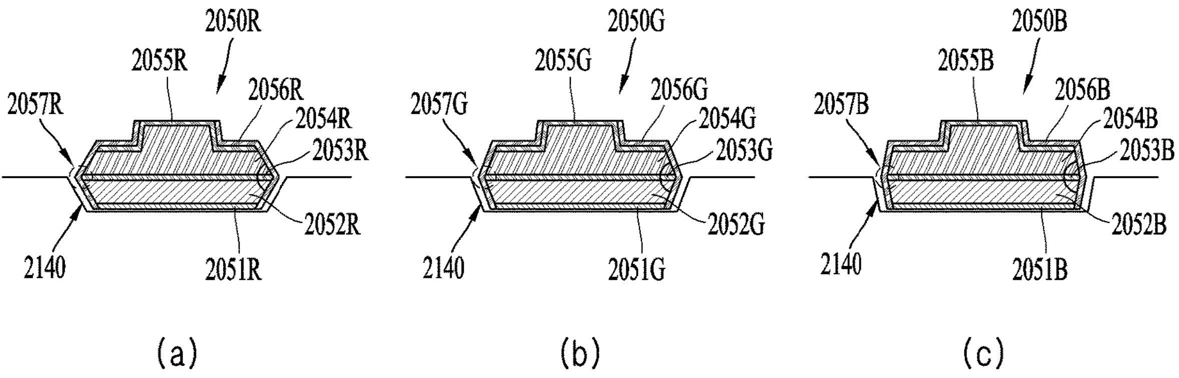
FIG. 17 is a conceptual view illustrating another embodiment of red, green, and blue semiconductor light-emitting elements according to the present disclosure.

FIG. 16 is a conceptual view illustrating one embodiment of red, green, and blue semiconductor light-emitting elements according to the present disclosure, and FIG. 17 is a conceptual view illustrating another embodiment of red, green, and blue semiconductor light-emitting elements according to the present disclosure.

According to the present disclosure, the semiconductor light-emitting element may include a tip 2057 on a side surface thereof. The tip 2057 may refer to a protruding portion relative to the other portion on the side surface. In the present disclosure, the red, green, and blue semiconductor light-emitting elements 2050R, 2050G, and 2050B may be formed differently in view of at least one of a thickness of one side based on the tip 2057 and an angle (or an inner angle) formed by the tip 2057 is different. In addition, the red, green, and blue semiconductor light-emitting elements 2050R, 2050G, and 2050B may be formed such that a cross-section including the tip 2057 is circular.

That is, according to the present disclosure, the red, green, and blue semiconductor light-emitting elements 2050R, 2050G, and 2050B may be formed to have structural differences in a vertical direction while maintaining a circular cross-section in the horizontal direction. According to the present disclosure, the red, green, and blue semiconductor light-emitting elements 2050R, 2050G, and 2050B may be formed to be mutually exclusive in the vertical direction while maintaining a circular structure that is most advantageous for self-assembly, thereby having position selectivity.

According to the present disclosure, the semiconductor light-emitting element may be a vertical semiconductor light-emitting element. In detail, each of the semiconductor light-emitting elements 2050R, 2050G, and 2050B may include a first conductive electrode 2051R, 2051G, 2051B, and a first conductive semiconductor layer 2052R, 2052G, 2052B disposed on the first conductive electrode 2051R, 2051G, 2051B, an active layer 2053R, 2053G, 2053B disposed on the first conductive semiconductor layer 2052R, 2052G, 2052B, a second conductive semiconductor layer 2054R, 2054G, 2054B disposed on the active layer 2053R, 2053G, 2053B, and a second conductive electrode 2055R, 2055G, 2055B disposed on the second conductive semiconductor layer 2054R, 2054G, 2054B. In addition, a surface of the semiconductor light-emitting element may be covered by a passivation layer 2056R, 2056G, 2056B. The passivation layer 2056R, 2056G, 2056B may be made of silicon oxide ($SiO2$) or silicon nitride ($SiNx$).

In the embodiment of the present disclosure, the first conductive electrode 2051R, 2051G, 2051B and the first conductive semiconductor layer 2052R, 2052G, 2052B may become an n-type electrode and an n-type semiconductor layer, respectively, and the second conductive electrode 2055R, 2055G, 2055B and the second conductive semiconductor layer 2054R, 2054G, 2054B may be a p-type electrode and a p-type semiconductor layer, respectively.

In the embodiment of the present disclosure, the first conductive electrode 2051R, 2051G, 2051B may include a metal electrode layer as an Ohmic electrode, and the second conductive electrode 2055R, 2055G, 2055B may include a transparent electrode layer such that light emitted in the active layer is extracted. In addition, the first conductive electrode and/or the second conductive electrode may include a magnetic layer (not illustrated).

In the structure of the semiconductor light-emitting element, the tip 2057R, 2057G, 2057B may be formed on the active layer 2053R, 2053G, 2053B. In other words, a side surface of the active layer may include the tip. As such, the structure including the tip 2057 on the side surface of the semiconductor light-emitting element may improve a phenomenon in which the semiconductor light-emitting element is assembled in an inclined state during self-assembly. In addition, the tip 2057 may be a portion protruding from a side surface of the semiconductor light-emitting element, relative to the other portion. The active layer 2053R, 2053G, 2053B may have a wider horizontal cross-sectional area than the other layers, and thus increase a light-emitting area. In addition, the semiconductor light-emitting element in the present disclosure has a vertical structure enabling front emission and rear reflection. This may increase the light-emitting area so as to improve light-emitting efficiency.

FIG. 16 illustrates an embodiment in which each of the red, green, and blue semiconductor light-emitting elements 2050R, 2050G, and 2050B is formed to have a different thickness on one side based on the tip 2057R, 2057G, 2057B. Specifically, each of the red, green, and blue semiconductor light-emitting elements 2050R, 2050G, and 2050B may be divided, based on the tip 2057R, 2057G, 2057B, into a part including the first conductive electrode 2051R, 2051G, 2051B and the first conductive semiconductor layer 2052R, 2052G, 2052B, and a part including the second conductive semiconductor layer 2054R, 2054G, 2054B and the second conductive electrode 2055R, 2055G, 2055B. The aforementioned one side may refer to the part including the first conductive electrode 2051R, 2051G, 2051B and the first conductive semiconductor layer 2052R, 2052G, 2052B. At this time, one side and the other side of the semiconductor light-emitting element may or may not include the active layer 2053R, 2053G, 2053B depending on a portion of the active layer where the tip 2057 is formed.

According to the one embodiment of the present disclosure, each of the red, green, and blue semiconductor light-emitting elements 2050R, 2050G, and 2050B may be formed such that the one side thereof including the first conductive electrode 2051R, 2051G, 2051B and the first conductive semiconductor layer 2052R, 2052G, 2052B, based on the tip 2057R, 2057G, 2057B, has a different thickness. The semiconductor light-emitting element may have position selectivity due to the different thickness of the one side thereof.

According to the embodiment, among the red, green, and blue semiconductor light-emitting elements 2050R, 2050G, and 2050B, the red semiconductor light-emitting element 2050R may have the thinnest thickness on the one side. In detail, since the red semiconductor light-emitting element 2050R is formed such that the first conductive semiconductor layer 2052R includes an AlInP layer and/or an AlGaInP layer. Therefore, as the thickness of the first conductive semiconductor layer 2052R increases, it tends that the red semiconductor light-emitting layer 2052R is easily stuck on a substrate during self-assembly. Accordingly, the red semiconductor light-emitting element 2050R is preferably manufactured such that the first conductive semiconductor layer is as thin as possible.

In addition, even if the first conductive semiconductor layer 2052R is formed thin in thickness, light efficiency of the red semiconductor light-emitting element 2050R is lowered less than those of the green and blue semiconductor light-emitting elements 2050G and 2050B. Therefore, the first conductive semiconductor layer 2052R of the red semiconductor light-emitting element 2050R is suitable to have the thinnest thickness. For example, the red semiconductor light-emitting element 2050R is preferably formed to have a total thickness of 4 μm or less in a stacking direction.

On the other hand, in the green and blue semiconductor light-emitting elements 2050G and 2050B, the semiconductor layer is grown mainly using gallium nitride (GaN). Due to the growth characteristics of the material, light efficiency decreases as a thickness decreases. Therefore, the green and red semiconductor light-emitting elements 2050G and 2050B are preferably formed to be thicker than the red semiconductor light-emitting element 2050R. For example, it is preferable that the green and blue semiconductor light-emitting elements 2050G and 2050B have a total thickness of 4 μm or more in the stacking direction.

In addition, in this embodiment, in order to secure exclusiveness among the red, green, and blue semiconductor light-emitting elements 2050R, 2050G, and 2050B during self-assembly, a thickness of one side of each semiconductor light-emitting element may have a difference of at least 0.5 μm or more. For example, the red semiconductor light-emitting element 2050R may be formed to have a total thickness of 4 μm or less in the stacking direction, the green semiconductor light-emitting element 2050G may be formed to have a total thickness in the range of 4.5 μm to 5 μm in the stacking direction, and the blue semiconductor light-emitting element 2050B may be formed to have a total thickness of 5.5 μm or more in the stacking direction. In this case, the green semiconductor light-emitting element 2050G and the blue semiconductor light-emitting element 2050B may be formed to have opposite thicknesses.

FIG. 17 illustrates an embodiment in which angles formed by the tips 2057R, 2057G, and 2057B of the red, green, and blue semiconductor light-emitting elements 2050R, 2050G, and 2050B are different from one another. According to another embodiment of the present disclosure, the red, green, and blue semiconductor light-emitting elements 2050R, 2050G, and 2050B may have position selectivity due to the difference of the angles formed by the tips 2057R, 2057G, and 2057B.

According to the embodiment, among the red, green, and blue semiconductor light-emitting elements 2050R, 2050G, and 2050B, the red semiconductor light-emitting element 2050R may have the smallest angle formed by the tip 2057R. In detail, the red semiconductor light-emitting element 2050R may be formed such that the first conductive semiconductor layer 2052R includes an AlInP layer and/or an AlGaInP layer. Of the AlInP layer and the AlGaInP layer, the AlInP layer may be disposed on the lowest portion of the first conductive semiconductor layer 2052R. However, since the AlInP layer is not easy to be etched due to its characteristics, an etching angle of the AlInP layer is gently less than 70 degrees. Accordingly, the red semiconductor light-emitting element 2050R is preferably formed such that the angle formed by the tip 2057R is 140 degrees or less.

On the other hand, in the green and blue semiconductor light-emitting elements 2050G and 2050B, the semiconductor layer is grown mainly using gallium nitride (GaN). Since an etching angle is easily adjusted in view of the characteristics of the corresponding material, the tips of the green and blue semiconductor light-emitting elements 2050G and 2050B may have any angle with the exclusiveness from the red semiconductor light-emitting layer 2050R. For example, the green and blue semiconductor light-emitting elements 2050G and 2050B may preferably be formed such that the angles formed by the tips thereof are 150 degrees or more.

In addition, in this embodiment, in order to secure the exclusiveness among the red, green, and blue semiconductor light-emitting elements 2050R, 2050G, and 2050B during self-assembly, the angle formed by the tip of each semiconductor light-emitting element may have a difference of at least 10 degrees or more. For example, the angle formed by the tip 2057R of the red semiconductor light-emitting element 2050R is 140 degrees or less, the angle formed by the tip 2057G of the green semiconductor light-emitting element 2050G may be in the range of 150 degrees to 160 degrees, and the angle formed by the tip 2057B of the blue semiconductor light-emitting element 2050B may be 170 degrees or more. In this case, the green semiconductor light-emitting element 2050G and the blue semiconductor light-emitting element 2050B may be formed to have opposite inner angles.

On the other hand, as illustrated in the drawings, the receiving holes 2140 in which the red, green, and blue semiconductor light-emitting elements 2050R, 2050G, and 2050B are seated may be formed to be different in at least one of a depth and an inclination of an inner surface to correspond to the structures of the red, green, and blue semiconductor light-emitting elements 2050R, 2050G, and 2050B, respectively.

Hereinafter, an embodiment of a method for manufacturing semiconductor light-emitting elements according to the present disclosure will be briefly described.

First, the first conductive semiconductor layer 2052, the active layer 2053, and the second conductive semiconductor layer 2054 are grown on a growth substrate. Specifically, the growth substrate may be selected from among a sapphire substrate, a Si substrate, a SiC substrate, a GaN substrate, a GaAs substrate, and a GaP substrate according to a color of light emitted by a semiconductor light-emitting element to be manufactured. The first conductive semiconductor layer 2052, the active layer 2053, and the second conductive semiconductor layer 2054 may be epitaxially grown on the growth substrate. In the case of the green and blue semiconductor light-emitting elements 2050G and 2050B, the first conductive semiconductor layers 2052G and 2052B and the second conductive semiconductor layers 2054G and 2054B may be configured to have a plurality of gallium nitride (GaN)-based layers. In the case of the red semiconductor light-emitting element 2050R, the first conductive semiconductor layer 2052R and the second conductive semiconductor layer 2054R may be configured to have a plurality of gallium phosphide (GaP) or gallium arsenide (GaAs)-based layers. Meanwhile, in this step, thicknesses of the first conductive semiconductor layers 2052R, 2052G, and 2052B formed on the growth substrate may be different according to the red, green, and blue semiconductor light-emitting elements 2050R, 2050G, and 2050B.

Next, mesa etching is performed, and the second conductive electrode 2055 is deposited on the second conductive semiconductor layer 2054. The mesa etching may be performed on a portion of the second conductive semiconductor layer 2054, and the second conductive electrode 2055 may be deposited on the entire surface of the second conductive semiconductor layer 2054.

Next, isolation etching may be performed to isolate the plurality of semiconductor light-emitting elements from one another. In one embodiment, after forming a mask pattern on the second conductive type electrode 2055, etching may be performed on an exposed area until the growth substrate is exposed. After the etching is completed, the mask pattern may be removed. In this step, side surfaces of the semiconductor light-emitting elements may have predetermined inclinations (or predetermined inclination angles) by the etching, and the red, green, and blue semiconductor light-emitting elements 2050R, 2050G, and 2050B may have different lateral inclinations. The side surfaces of the semiconductor light-emitting elements formed in this step may correspond to upper areas of the final semiconductor light-emitting elements with respect to the tips 2057.

Next, the plurality of semiconductor light-emitting elements are transferred to a temporary substrate, and the growth substrate is removed. After bonding the plurality of semiconductor light-emitting elements formed on the growth substrate with the temporary substrate (that is, in a state where the plurality of semiconductor light-emitting elements and the temporary substrate are bonded together, the growth substrate may be disposed on one side and the temporary substrate may be disposed on another side with respect to the plurality of semiconductor light emitting elements), the growth substrate may be removed by laser lift-off (LLO) or chemical lift-off (CLO). An adhesive material may be applied on one surface of the temporary substrate, and the plurality of semiconductor light-emitting elements may be transferred to the one surface on which the adhesive material is applied. Also, the temporary substrate may include a sacrificial layer, and the adhesive material may be applied on the sacrificial layer.

In order to form the tips 2057, the plurality of semiconductor light-emitting elements may be etched on the side of the first conductive semiconductor layers 2052. In this process, the side surfaces of the semiconductor light-emitting elements corresponding to lower areas with respect to the tips 2057 may have predetermined inclinations. At this time, the side surfaces of the semiconductor light-emitting elements corresponding to the lower areas with respect to the tips 2057 may have substantially the same inclination angle (degree) as the side surfaces of the semiconductor light-emitting elements corresponding to the upper areas with respect to the tips 2057. Also, in this step, the red, green, and blue semiconductor light-emitting elements 2050R, 2050G, and 2050B may have different lateral inclinations.

Finally, after the etching process is completed, the first conductive electrodes 2051 are deposited on the first conductive semiconductor layers 2052, and then the temporary substrate may be removed.

The method of manufacturing the semiconductor light-emitting elements described above may further include additionally forming a passivation layer 2056, a magnetic layer (not illustrated), and the like. In addition, the method of manufacturing the semiconductor light-emitting elements described above is merely illustrative, and other manufacturing methods may be applied to manufacture the semiconductor light-emitting elements according to the present disclosure.

The foregoing description is merely illustrative to explain the technical idea of the present disclosure, and it will be apparent to those skilled in the art that various modifications and variations can be made without departing from the essential characteristics of the present disclosure.

Therefore, the embodiments disclosed in the present disclosure are not intended to limit the technical spirit of the present disclosure, but to explain, and the scope of the technical spirit of the present disclosure is not limited by these embodiments.

The scope of the present disclosure should be construed according to the claims below, and all technical ideas within the scope equivalent thereto should be construed as being included in the scope of the present disclosure.

The invention claimed is:

1. A display device having a red semiconductor light-emitting element, a green semiconductor light-emitting element, and a blue semiconductor light-emitting element, the display device comprising:

a substrate on which the red, green and blue semiconductor light-emitting elements are disposed; and receiving holes formed in the substrate such that the red, green, and blue semiconductor light-emitting elements are seated therein, wherein each of the red, green, and blue semiconductor light-emitting elements includes a tip on a side surface thereof, wherein the red, green, and blue semiconductor light-emitting elements differ from one another with respect to a tip angle defined by the tip of each respective semiconductor light-emitting element, wherein the tip angle of the red semiconductor light-emitting element is smaller than the tip angle of the green semiconductor light-emitting element and the tip angle of the blue semiconductor light-emitting element, and wherein a difference between the tip angles of the red, green, and blue semiconductor light-emitting elements is at least 10 degrees.

2. The display device of claim 1, wherein each of the red, green and blue semiconductor light-emitting elements is formed such that a cross section thereof including the tip is circular.

3. The display device of claim 1, wherein each of the red, green and blue semiconductor light-emitting elements comprises:

a first conductive electrode;

a first conductive semiconductor layer on which the first conductive electrode is disposed;

an active layer formed on the first conductive semiconductor layer;

a second conductive semiconductor layer formed on the active layer; and a second conductive electrode disposed on the second conductive semiconductor layer to be spaced apart from the first conductive electrode in a horizontal direction, and the tip is formed on the active layer, wherein the red semiconductor light-emitting element includes an AlInP layer disposed on a lowest portion of the first conductive semiconductor layer, wherein the first and second semiconductor layers of the green and blue semiconductor light-emitting elements are grown using gallium nitride (GaN), wherein the red semiconductor light-emitting element is formed such that the tip angle is 140 degrees or less such that an etching angle of the AlInP layer is less than 70 degrees, and wherein the green and blue semiconductor light-emitting elements are formed such that the tip angles are 150 degrees or more.

4. The display device of claim 3, wherein each of the red, green, and blue semiconductor light-emitting elements includes the first conductive electrode and the first conductive semiconductor layer disposed on one side thereof and the second conductive semiconductor layer and the second conductive electrode disposed on another side, with respect to the tip.

5. The display device of claim 4, wherein each of the red, green, and blue semiconductor light-emitting elements is configured such that the one side, with respect to the tip, including the first conductive electrode and the first conductive semiconductor layer has a different thickness.

6. The display device of claim 5, wherein the red semiconductor light-emitting element, among the red, green and blue semiconductor light-emitting elements, is configured such that the one side thereof has a thinnest thickness.

7. The display device of claim 5, wherein the red, green and blue semiconductor light-emitting elements have a thickness difference of at least 0.5 μm or more on the one side.

8. The display device of claim 1, wherein the receiving holes in which the red, green, and blue semiconductor light-emitting elements are seated are formed differently in view of at least one of a depth and an inclination of an inner surface thereof to correspond to the red, green, and blue semiconductor light-emitting elements.

* * * * *